United States Patent [19]

Nakajima et al.

[11] Patent Number: 5,585,647
[45] Date of Patent: Dec. 17, 1996

[54] INTEGRATED CIRCUIT DEVICE HAVING AN INSULATING SUBSTRATE, AND A LIQUID CRYSTAL DISPLAY DEVICE HAVING AN INSULATING SUBSTRATE

[75] Inventors: Mitsuo Nakajima, Koshigaya; Mitsuaki Suzuki, Tokyo; Takaaki Kamimura, Fukaya; Yoshito Kawakyu, Kawasaki, all of Japan

[73] Assignee: Kabushiki Kaisha Toshiba, Kawasaki, Japan

[21] Appl. No.: 266,467

[22] Filed: Jun. 27, 1994

[30] Foreign Application Priority Data

Jun. 29, 1993 [JP] Japan .................................. 5-158369
Mar. 15, 1994 [JP] Japan .................................. 6-042978

[51] Int. Cl.⁶ .................. H01L 31/0392; H01L 31/20; H01L 31/113; G02F 1/1343
[52] U.S. Cl. .................. 257/72; 257/59; 257/291; 257/347; 257/352; 349/42
[58] Field of Search ..................... 257/59, 72, 290, 257/291, 347, 352, 357; 359/59

[56] References Cited

U.S. PATENT DOCUMENTS 5,076,666 12/1991 Katayama et al. ................. 257/290

FOREIGN PATENT DOCUMENTS

| 62-73658 | 4/1987 | Japan . | |
|---|---|---|---|
| 4184424 | 7/1992 | Japan | 257/59 |
| 4299867 | 10/1992 | Japan | 257/59 |
| 4362616 | 12/1992 | Japan | 359/59 |
| 5232506 | 9/1993 | Japan | 359/59 |
| 5249491 | 9/1993 | Japan | 359/59 |
| 5299653 | 11/1993 | Japan . | |
| 6148686 | 5/1994 | Japan | 359/59 |

*Primary Examiner*—Sara W. Crane
*Assistant Examiner*—Alice W. Tang
*Attorney, Agent, or Firm*—Oblon, Spivak, McClelland, Maier, & Neustadt, P.C.

[57] ABSTRACT

A thin-film transistor device comprising a pixel section including a plurality of pixel electrodes arranged in rows and columns on a substrate and a plurality of thin-film transistors of reverse stagger type, connected as switching elements to the pixel electrodes, respectively, and a drive section including a plurality of thin-film transistors of coplanar type, each having a gate insulating film, for driving the thin-film transistors of the reverse stagger type. A lower insulating film is located beneath the thin-film transistors of the reverse stagger type. The lower insulating film and the gate insulating films of the thin-film transistors of the coplanar type are formed of a first insulating film provided on the substrate.

15 Claims, 13 Drawing Sheets

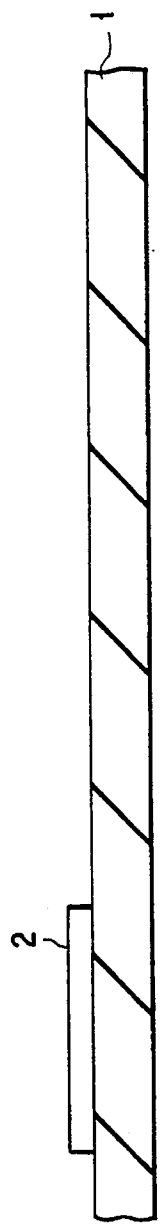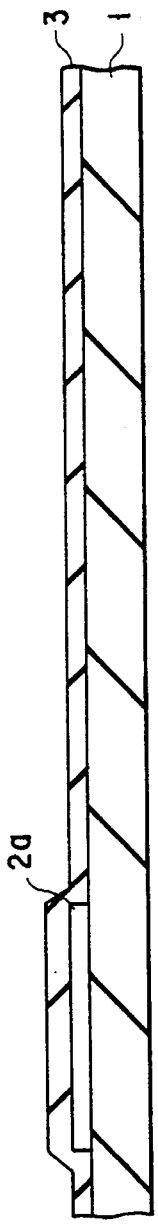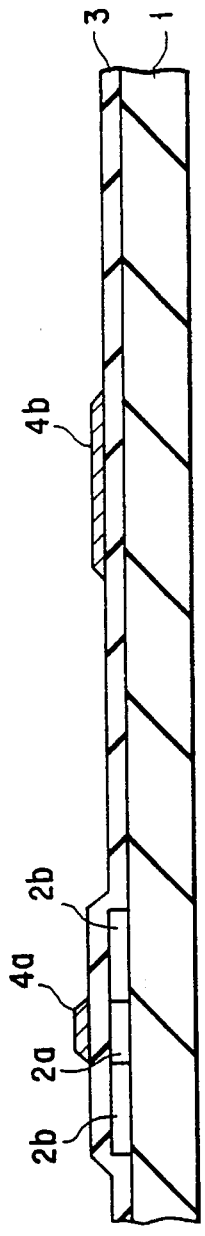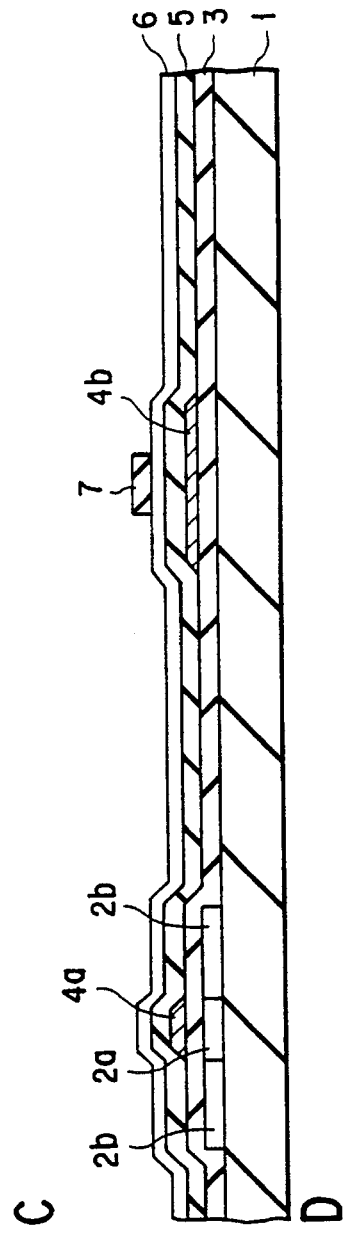
FIG. 1A
FIG. 1B
FIG. 1C
FIG. 1D

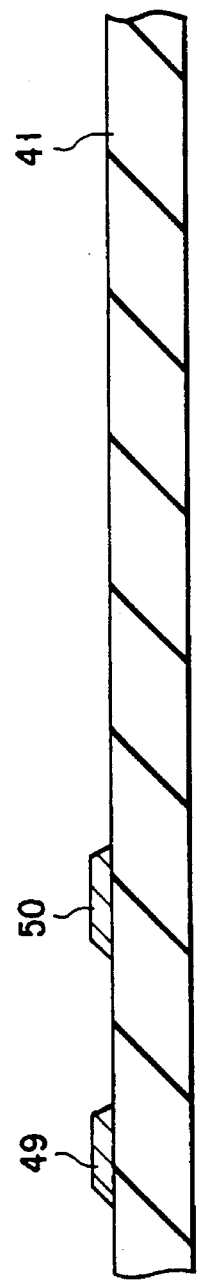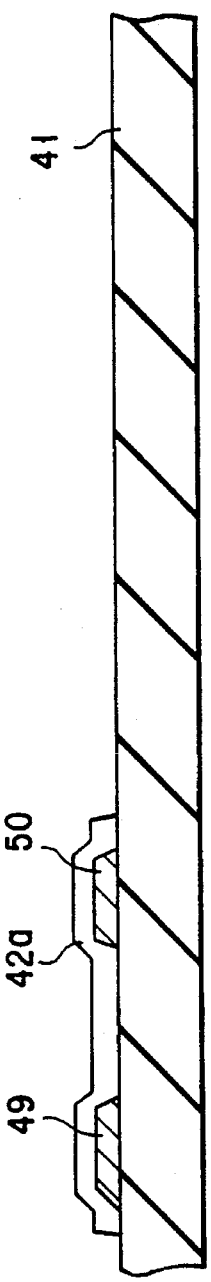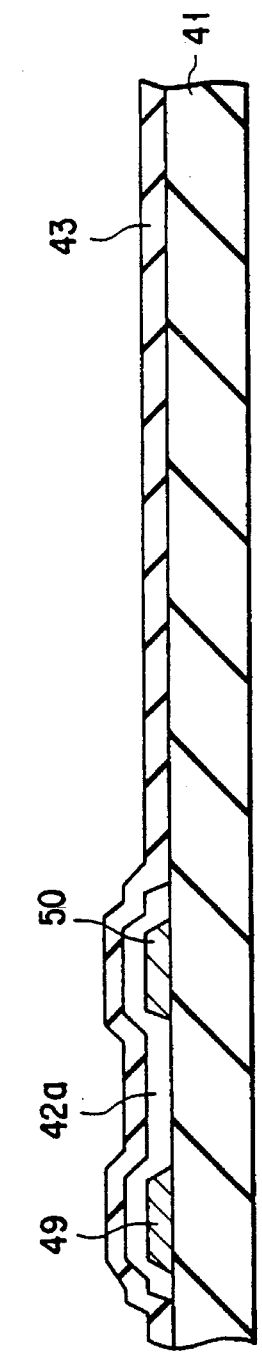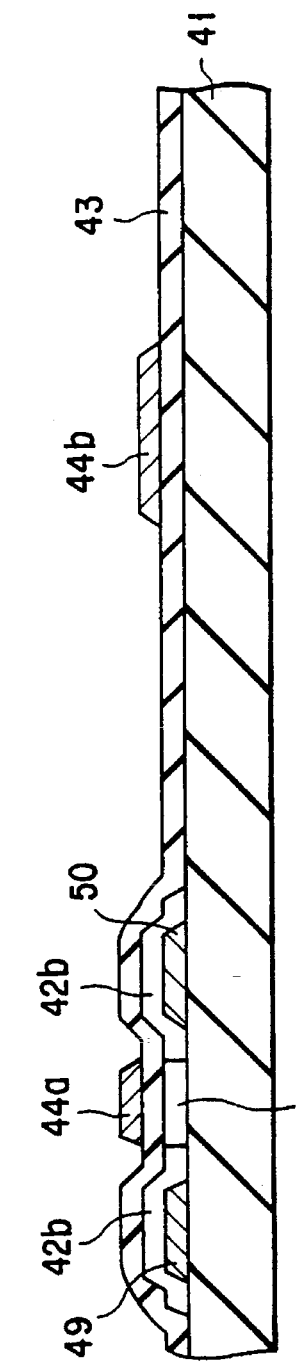

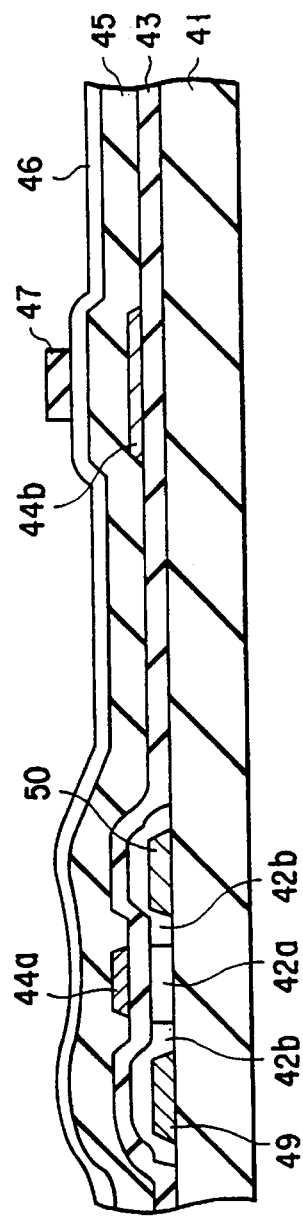
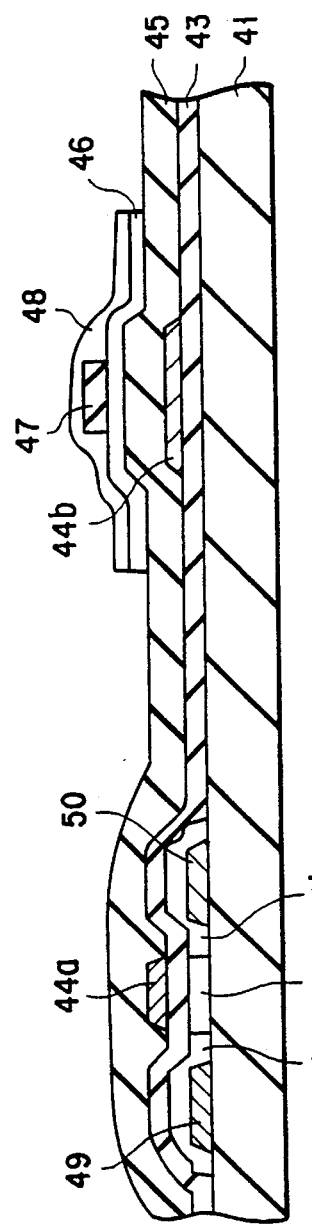
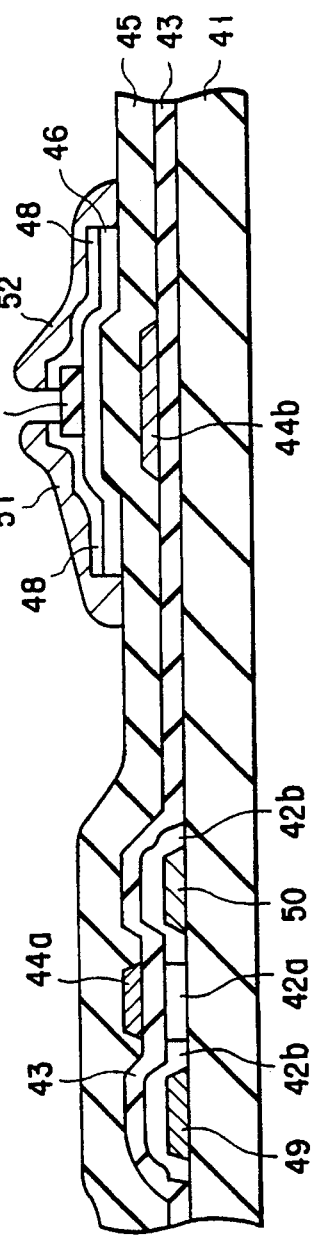
FIG. 8A
FIG. 8B
FIG. 8C

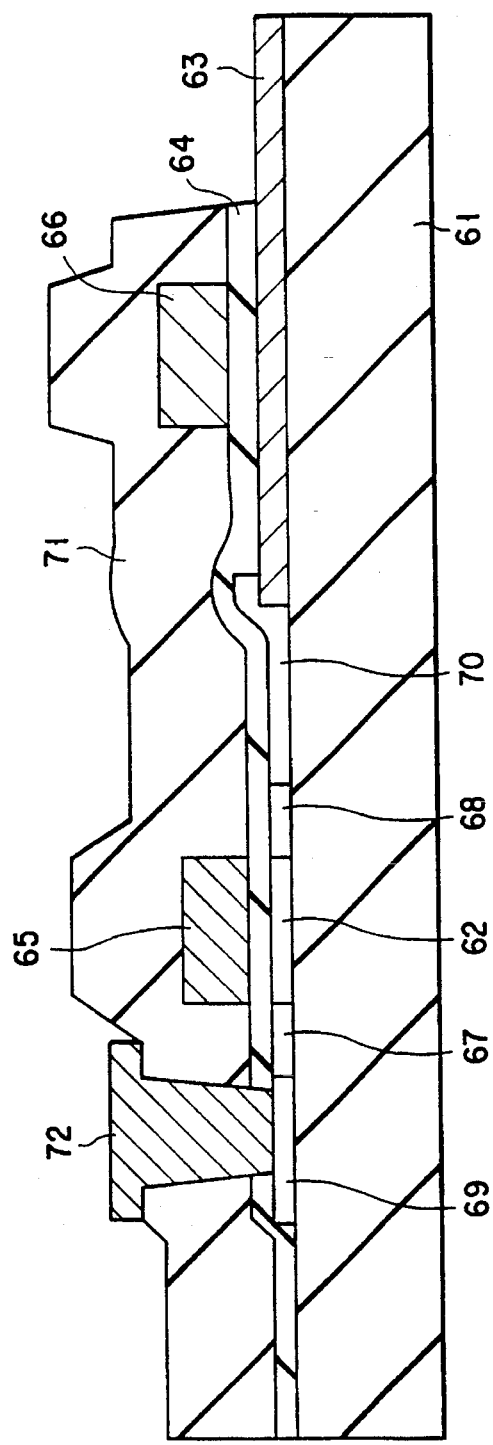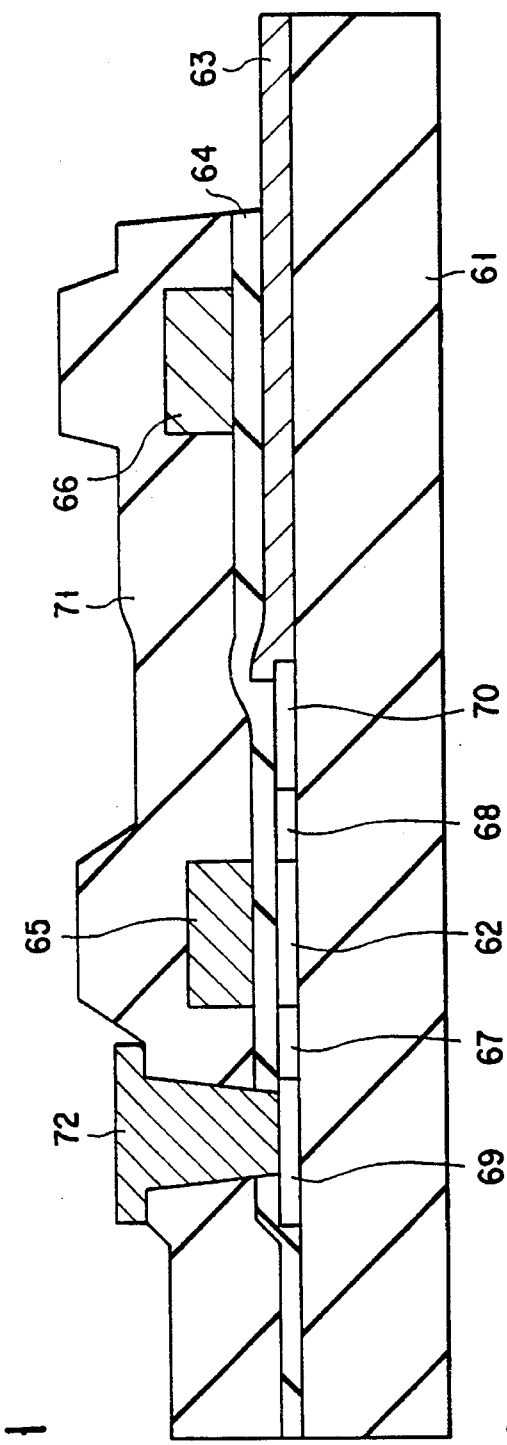
FIG. 11
FIG. 12

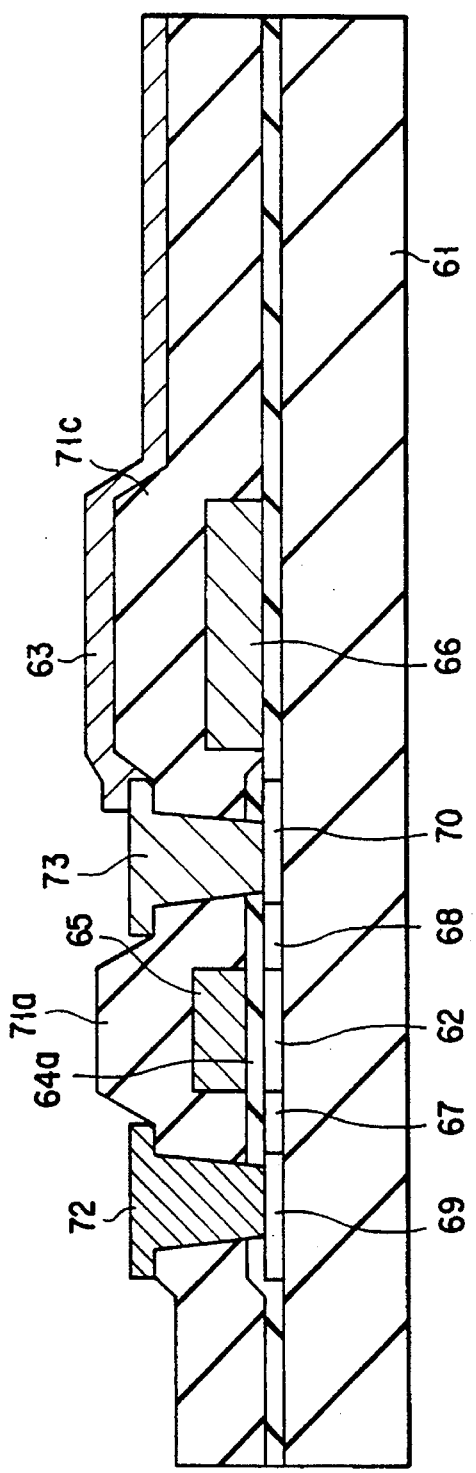
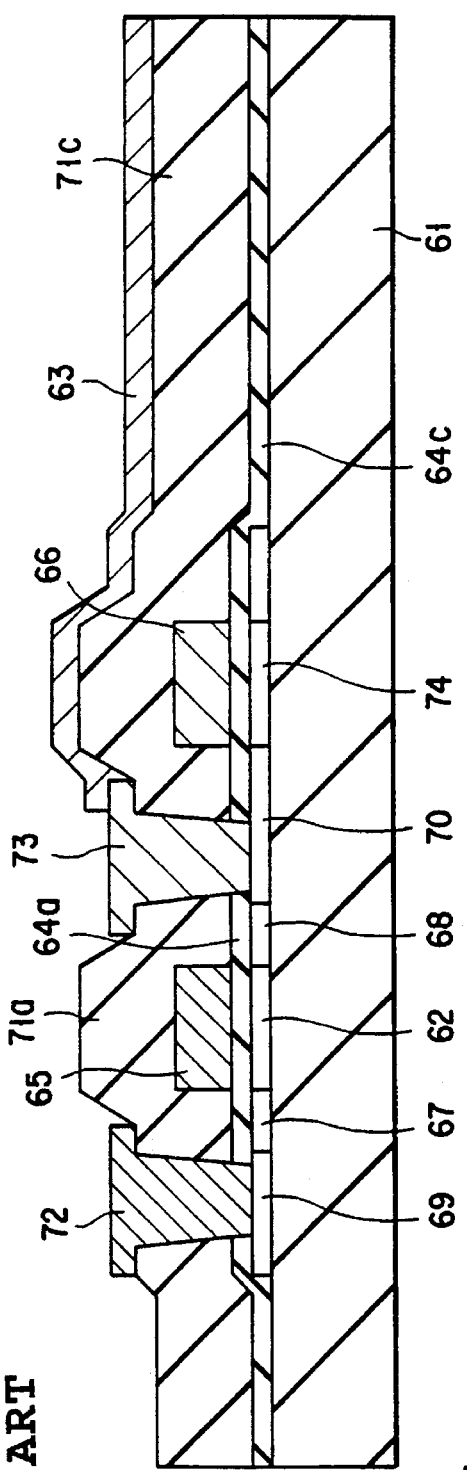
FIG. 13 PRIOR ART
FIG. 14 PRIOR ART

INTEGRATED CIRCUIT DEVICE HAVING AN INSULATING SUBSTRATE, AND A LIQUID CRYSTAL DISPLAY DEVICE HAVING AN INSULATING SUBSTRATE

BACKGROUND OF THE INVENTION

1. Field of the Invention

The present invention relates to an integrated circuit device having an insulating substrate and also a liquid crystal display device having an insulating substrate.

2. Description of the Related Art

A liquid crystal display is advantageous in that it is thin, light and is driven by a low voltage. The display is advantageous also in that it is capable of displaying color images more easily than other types of display devices. For these advantage, the liquid crystal display has recently been used in personal computers and word processors. Of the various liquid crystal displays known, an active matrix liquid crystal display having amorphous silicon thin-film transistors (a-SiTFTs) used as switching elements is particularly advantageous. Even if it has an increased number of pixels, neither contrast nor response decreases.

Amorphous silicon (a-Si) has lower carrier mobility than crystalline silicons (i.e., single crystal silicon and polycrystalline silicon). Hence, a-Si is not used in any section of a liquid crystal display, such as the drive section which needs to operate at high speed. Instead, a driving IC which has no a-SiTFTs is used as the drive section of the liquid crystal display. If incorporated in the liquid crystal display, however, the driving IC will decrease the reliability of the display and the manufacturing cost thereof.

To solve this problem, it has been proposed that an annealing method be performed on an amorphous silicon layer formed on a substrate, by applying an energy beam (e.g., a laser beam or an electron) onto selected portions of the amorphous silicon layer, thereby changing the selected portions of the layer into crystalline silicon. This method can form a drive section having crystalline silicon TFTs and a pixel section having a-SiTFTs formed monolithically—that is, on one and the same substrate. In this case, the crystalline SiTFTs of the driving section are of coplanar type, whereas the a-SiTFTs of the pixel section are of reverse stagger type more widely used than any other type of a-SiTFTs.

FIGS. 15A to 15D and FIGS. 16A to 16D are cross sectional views, explaining how the drive section and the pixel section are formed monolithically, on the same substrate. In these figures, the left half is the drive section, and the right half the pixel section.

First, as shown in FIG. 15A, an amorphous silicon film 162 is deposited on the upper surface of an insulating substrate 161. Then, a laser beam is applied onto the amorphous silicon layer, converting the layer to a crystalline (polycrystalline or single crystal) silicon film 162. Thereafter, the crystalline silicon film 162 is etched by means of photolithography, thereby removing all film 162 but that portion which will be used as a drive-section region.

Next, as illustrated in FIG. 15B, an electrode 163 is formed on the pixel-section region of the insulating substrate 161. The electrode 163 will be used as the gate electrode of a reverse stagger TFT. More specifically, a metal film is formed on the upper surface of the structure shown in FIG. 15A and is subsequently etched by photolithography, forming the gate electrode 163.

Then, as shown in FIG. 15C, a gate insulating film 164 is deposited on the upper surface of the entire structure shown in FIG. 15B. This film 164 is a component common to a coplanar TFT and a reverse stagger TFT which are to be fabricated on the substrate 161. Further, an amorphous silicon film 165 is deposited on the gate insulating film 164; the film 165 serves as the high-resistance semiconductor film of the reverse stagger TFT. An insulating film 166 is deposited on the amorphous silicon film 165; the film 166 will be processed to form the channel protective film of the reverse stagger TFT.

As shown in FIG. 15D, the insulating film 166 is etched by photolithography, forming the channel protective film of the reverse stagger TFT. An $n^+$ amorphous silicon film 167 is deposited on the upper surface of the structure. This film 167 will serve as an ohmic contact layer of the reverse stagger TFT.

Next, as illustrated in FIG. 16A, the amorphous silicon film 165 and the $n^+$ amorphous silicon film 167 are subjected to photolithography etching, forming films having prescribed shapes and sizes. This done, the gate insulating film 164 is etched by photolithography, making a hole (not shown) for exposing the gate electrode 163 of the reverse stagger TFT.

Then, an electrically conductive film is deposited on the upper surface of the entire structure of FIG. 16A. The conductive film is subjected to photolithography etching, thereby forming the source electrode 168 of the reverse stagger TFT, the drain electrode 169 thereof, and the gate electrode 170 of the coplanar TFT, as is illustrated in FIG. 16B. Furthermore, ions are implanted into a part of the crystalline silicon film 162, by using the gate electrode 170 as a mask. That part of the film 162 is thereby converted into a low-resistance silicon film 162a.

As shown in FIG. 16C, that portion of the $n^+$ amorphous silicon film 167 which is located between the source electrode 168 and the drain electrode 168 is etched away, thus exposing a part of the channel protective film of the reverse stagger TFT. An insulating film (not shown) is deposited on the upper surface of the entire structure. This insulating film is subjected to photolithography etching, forming an interlayer insulating film 171 of the coplanar TFT which functions as a driving TFT.

Next, as shown in FIG. 16D, a conductive film is deposited on the upper surface of the entire structure and etched by photolithography, forming the source electrode 172 and drain electrode 173 of the coplanar TFT. Thus, there is formed a device having a coplanar TFT and a reverse stagger TFT, both formed on the same insulating substrate 161.

This device, however, have the following problems.

First, since the gate insulating film 164 is common to a coplanar TFT and a reverse stagger TFT, both thin-film transistors cannot have a gate insulating film of an optimal thickness. This is a great design problem.

Secondly, the crystalline silicon film 162 reacts with with the metal film to be processed into the gate electrode 163, forming silicide. The silicide, thus formed, renders it no longer possible for the crystalline silicon film 162 to function as a high-resistance semiconductor film.

Thirdly, in the case where the crystalline silicon film 162 is etched by means of chemical dry etching, its surface is roughened. Hence, the gate electrode 163 formed in a later step will likely exfoliate from the insulating substrate 161, inevitably impairing the reliability of the device.

Lastly, etching scum is formed while the metal film is being etched to form the gate electrode 163. The etching scum formed causes an increase in the leak current between the coplanar TFT and the reverse stagger TFT.

The manufacturing steps shown in FIGS. 15A and 15B may be modified such that the gate electrode 163 is formed first and the crystalline silicon film 162 is formed next. In this case, there occur the following problems.

As chemical dry etching is performed on the metal film to form the gate electrode 163, the insulating substrate 161 has its surface roughened. Deposited on the rough surface of the substrate 161, the crystalline silicon film 162 has its crystallinity degraded, ultimately impairing the characteristics of the coplanar stagger TFT. Furthermore, since the gate electrode 163 is made of Mo-Ta alloy, Al or Al-Ta alloy as in devices of this type, the etching rate of the metal film for the electrode 163 cannot be much higher that that of the crystalline silicon film 162. In other words, the metal film cannot have prominent etching selectivity with respect to the crystalline silicon film 162. Thus, when the film 162 formed after the gate electrode 163 is patterned by chemical dry etching, the gate electrode 163 would be more etched than necessary.

The crystalline silicon film 162 can be etched with alkaline etching solution, not by chemical dry etchant. However, alkaline etching solution is not appropriate for use in the manufacture of semiconductor devices.

SUMMARY OF THE INVENTION

The object of the present invention is to provide a novel an integrated circuit device having insulating substrate which can be modified in various ways.

To attain the object, according to the invention there is provided an integrated circuit device having an insulating substrate comprising: a thin-film transistor of a first type provided above an insulating substrate; a thin-film transistor of a second type provided on the substrate and having a gate insulating film; and a lower insulating film located beneath the thin-film transistor of the first type, wherein the lower insulating film and the gate insulating film of the thin-film transistor of the second type are formed of a first insulating film provided on the substrate.

The integrated circuit device having an insulating substrate according to the invention is novel in that the lower insulating film provided beneath the thin-film transistor of the first type and the gate insulating film of the thin-film transistor of the second type are formed of the same first insulation film.

The device can be modified such that the gate insulating film of the thin-film transistor of the first type and the upper insulating film of the thin-film transistor of the second type are made of a second insulating film. In the modified device, the gate insulating films of these thin-film transistors are separated from each other and can, therefore, have an optimal thickness each.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are sectional views explaining the first several steps of a method of manufacturing the TFT substrate of an active type liquid crystal display which is a first embodiment of the present invention;

FIGS. 7A to 7D are sectional views explaining the first several steps of a method of manufacturing the TFT substrate of an active type liquid crystal display which is a third embodiment of the invention;

FIGS. 8A to 8C are sectional views explaining the remaining steps of the method of manufacturing the TFT substrate of the third embodiment;

FIG. 11 is a sectional view illustrating the basic structure of the TFT substrate of the fifth embodiment;

FIG. 12 is a sectional view showing the basic structure of the TFT substrate of an active type liquid crystal display according to a sixth embodiment of the present invention;

FIG. 13 is a sectional view showing the basic structure of the TFT substrate of a conventional active type liquid crystal display;

FIG. 14 is a sectional view showing the basic structure of the TFT substrate of another conventional active type liquid crystal display;

DETAILED DESCRIPTION OF THE PREFERRED EMBODIMENTS

Figure 2A:
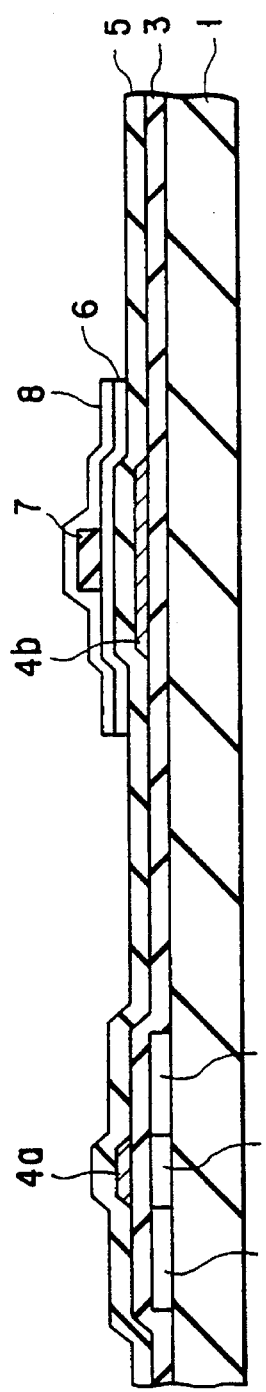
FIGS. 2A to 2C are sectional views explaining the remaining steps of the method of manufacturing the TFT substrate of the first embodiment.

Embodiments of the present invention will now be described, with reference to the accompanying drawings.

FIGS. 1A to 1D and FIGS. 2A to 2C are sectional views explaining a method of manufacturing the TFT substrate of an active type liquid crystal display according to a first embodiment of this invention. The right half of the structure shown in each of these figures is the pixel section of the TFT substrate, which comprises a reverse stagger TFT. The left half of the structure is the drive section of the TFT substrate, which comprises a coplanar TFT for driving the reverse stagger TFT. The reverse stagger TFT is a switching element provided for one of the pixel electrodes (not shown) which are arranged in rows and columns on an insulating substrate. The liquid crystal display device may have a liquid crystal layer which is provided on the pixel electrodes and which includes molecules whose orientation is changed by a potential of each pixel electrode, and a substrate opposing the insulating substrate and sandwiching the liquid crystal layer, in cooperation with the insulating substrate.

How the TFT substrate is manufactured will now be explained, with reference to FIGS. 1A to 1D and FIGS. 2A to 2C.

First, an amorphous silicon film 2 is formed on an insulating substrate 1 by means of CVD method such as plasma CVD method or LPCVD method. The film 2 is subjected to photolithography, forming an amorphous silicon film 2 having a prescribed shape and size, as illustrated in FIG. 1A.

The thicker the amorphous silicon film 2, the longer the time required for crystallizing the film 2, and the smaller the throughput. It is desirable that the amorphous silicon film 2 be as thin as possible. If the film 2 is too thin, however, it can no longer be crystallized. Hence, in the present embodiment, the film 2 has a thickness of, for example, 10 to 100 nm, preferably 20 to 50 nm. The insulating substrate 1 is made of transparent insulating material such as glass or quartz. Alternatively, the substrate 1 may be a plate coated with insulating material.

Next, as shown in FIG. 1B, a first insulating film 3 is formed on the upper surface of the entire structure. The first insulating film 3 will serve as the gate insulating of the coplanar TFT and also as the substrate-protecting film (i.e., lower insulating film) of the reverse stagger TFT.

The first insulating film 3 has a thickness of 50 to 500 nm, preferably 75 to 100 nm. It is desirable that the film 3 be as thin as possible, provided that it exhibits sufficient insulating property. The thicker the film 3, the longer the time required for implanting ions into the film 2. The longer this time, the smaller the throughput. The film 3 is, for example, a silicon oxide film, a silicon nitride film, or a multi-layer film composed of these. The film 3 is formed by, for example, ECR-CVD method, plasma CVD method or APCVD method.

Thereafter, a high-energy beam, such as an excimer laser beam (more precisely, a beam emitted from an XeCl excimer laser or XeF excimer laser), is applied onto the amorphous silicon film 2. The amorphous silicon film 2 is thereby annealed and converted into a crystalline (either single crystal or polycrystalline) silicon film 2a, which serves as a high-resistance semiconductor film. The high-energy beam may be applied to the entire surface of the amorphous silicon film 2. However, in order to increase the throughput, it would be more desirable that the beam be applied to only the drive-section region of the film 2.

If necessary, dopant may be introduced into the amorphous silicon film 2 before the film 2 is irradiated with the high-energy beam. The dose of the dopant can be adjusted, to thereby control the threshold voltage of the TFT which will be formed. Then, there will be manufactured a TFT substrate having characteristics similar to the design characteristics. Then, a metal film is deposited on the upper surface of the entire structure. The metal film is etched by photolithography, forming the gate electrode 4a of the coplanar TFT and the gate electrode 4b of the reverse stagger TFT as is illustrated in FIG. 1C. The metal film is made of, for example, MoTa alloy, aluminum (Al), TaW alloy, MoW alloy or silicide of any one of these. The surface of the metal film may be anodized.

The metal film has a thickness of 100 to 300 nm, typically 200 nm, for a specific reason. If the gate electrodes 4a and 4b are thicker than 300 nm, the throughput will decrease. If the electrodes 4a and 4b are thinner than 100 nm, they will likely be discontinuous, reducing the yield of the TFT substrate. The metal film may be formed by, for example, sputter method, may be etched by, for example, chemical dry etching.

The first insulating film 3 is located between the crystalline silicon film 2a (i.e., the high-resistance semiconductor film) of the coplanar TFT and the metal film of which the gate electrode 4b of the reverse stagger TFT will be formed. Put another way, the metal film does not contact the crystalline silicon film 2a. Hence, no metal silicide will be formed, and the resistance of the crystalline silicon film 2a will not decrease.

While the amorphous silicon film 2 is being etched by chemical dry etching to form the structure shown in FIG. 1A, the insulating substrate 1 may have its surface roughened. Even so, the gate electrode 4b will not exfoliate as in the manufacture of the conventional thin-film transistor device. This is because the gate electrode 4b is formed on the first insulating film 3, not on the insulating substrate 1. Furthermore, even if the insulating substrate 1 has a rough surface after the dry chemical etching, the gate electrode 4b will not exfoliate, since it is the first insulating film 3, not the metal film, that contacts the insulating substrate 1.

After the gate electrodes 4a and 4b have been formed, an impurity such as phosphorus (P), boron (B), or arsenic As is ion-implanted into the crystalline silicon film 2a, by using the gate electrode 4a as a mask. A high-energy beam, such as an excimer laser beam, is applied to a selected portion of the crystalline silicon film 2a, annealing this portion of the film 2a. That portion of the film 2a is thereby crystallized into a low-resistance crystalline silicon film 2b.

It should be noted that the impurity is ion-implanted at a dose ranging, for example, from $1\times10^{15}$ to $1\times10^{17}/cm^2$. The high-energy beam may be applied to the film 2a from above the first insulating film 3, or from below the insulating substrate 1. The beam may be applied onto the entire surface of the structure shown in FIG. 1C. Nonetheless, in order to increase the throughput, it is desirable to apply the beam onto only the drive-section region of the structure. The selected portion of the crystalline silicon film 2a may be annealed after an insulating film 5 is formed in the next step. If so, the high-energy beam does less damage to the gate electrodes 4a than otherwise, which serves to increase the yield of the TFT substrate.

The crystalline silicon film 2a may be annealed in an atmosphere of an annealing gas, not by being irradiated with a high-energy beam.

Next, as shown in FIG. 1D, a second insulating film 5 is deposited on the upper surface of the entire structure, and an amorphous silicon film 6 is deposited on the second insulating film 5. The second insulating film 5 works as an inter-layer insulating film in the coplanar TFT and also as the gate insulating film of the reverse stagger TFT. The amorphous silicon film 6 serves as a high-resistance semiconductor film in the reverse stagger TFT.

The second insulating film 5 has a thickness of, for example, 200 to 400 nm. If the film 5 is thicker than 400 nm, the throughput will decrease. If it is thinner than 200 nm, the yield of the TFT substrate will be low. The second insulating film 5 is, for example, a silicon oxide film, a silicon nitride film, or a multi-layer film composed of these. The second insulating film 5 and the amorphous silicon film 6 are formed by CVD method such as plasma CVD method, photo CVD method or APCVD method.

Then, an insulating film is formed on the amorphous silicon film 6 by means of a CVD method such as plasma CVD method or photo CVD method. The insulating film is etched by photolithography, forming the channel protective film 7 of the reverse stagger TFT.

The thicker the insulating film, the more greatly the throughput will be reduced. Conversely, the thinner the film, the less effectively the film will function as a channel protective film. In view of this, the insulating film is, for example, 200 nm thick. The thickness of the film need not be limited to 200 nm, so long as the the throughput is sufficiently large and the film works as a channel protective film.

The gate insulating film of the reverse stagger TFT is made of the second insulating film 5, whereas the gate insulating film of the coplanar TFT is made of the first insulating film 3. Therefore, these gate insulating films can have an optimal thickness each.

Next, an $n^+$ type amorphous silicon film 8 is formed to a thickness of, for example, 50 nm, on the upper surface of the structure shown in FIG. 1D by means of a CVD method such as a plasma CVD or photo CVD method. The $n^+$ type amorphous silicon film 8 and the amorphous silicon film 6 are etched by photolithography, forming two films of the same shape and size, as illustrated in FIG. 2A. The $n^+$ type amorphous silicon film 8, thus formed, serves as the ohmic contact layer of the reverse stagger TFT. This film 8 may be replaced by a low-resistance semiconductor film of another semiconductor material. The ohmic contact layer may be made of $n^+$ type microcrystalline silicon.

Figure 2B:
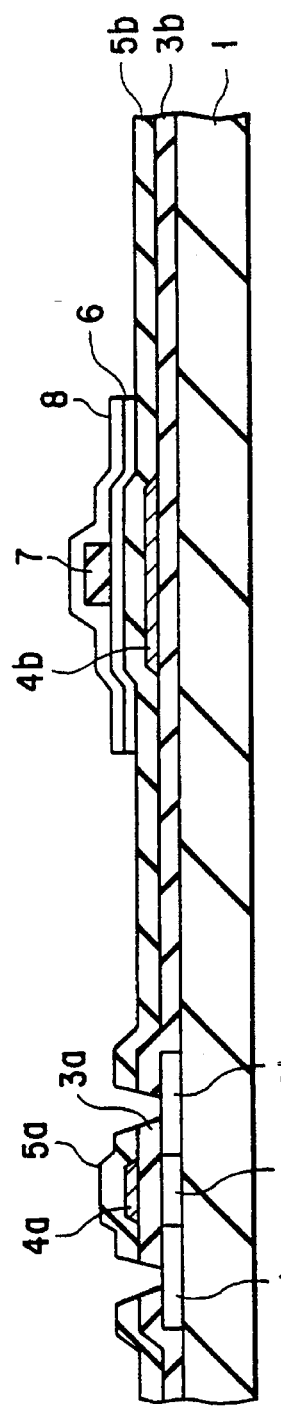

Then, the first insulating film 3 and the second insulating film 5 are etched by photolithography. The first insulating film 3 is thereby cut, as shown in FIG. 2B, into the gate insulating film 3a of the coplanar TFT and the lower insulating film 3b of the reverse stagger TFT. Similarly, the second insulating film 5 is thereby cut, as shown in FIG. 2B, into the inter-layer insulating film 5a (upper insulating film) of the coplanar TFT and the gate insulating film 5b of the reverse stagger TFT. At the same time, contact holes (not shown) are made in the films 3 and 5, in which the gate, source and drain electrodes of the coplanar TFT will be formed, and a contact hole (not shown) is made in the films 3 and 5, in which the gate electrode of the reverse stagger TFT will be formed.

Figure 2C:
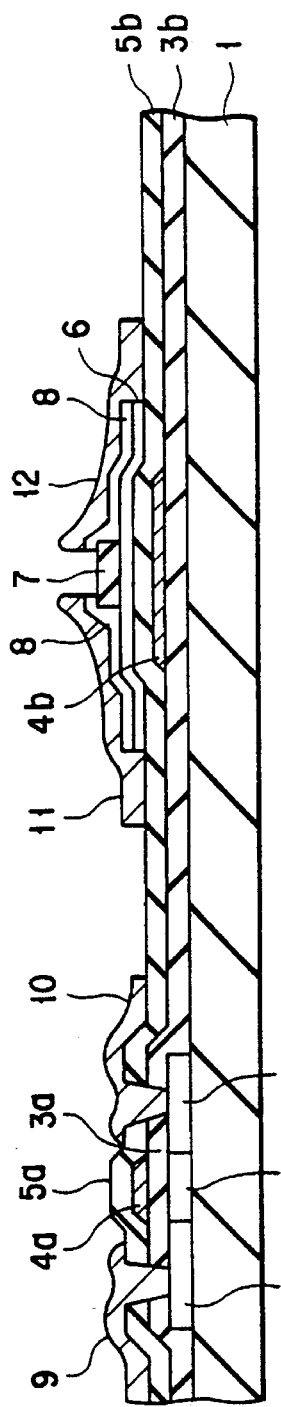

Next, two metal films such as Mo films, Al films or Cr films, each having a thickness of, for example, 300 to 500 nm, are formed by, for example, sputtering, on the upper surface of the entire structure shown in FIG. 2B. The metal films are etched by means of photolithography, forming the source electrode 9 and drain electrode 10 of the coplanar TFT and also the source electrode 11 and drain electrode 12 of the reverse stagger TFT, as is illustrated in FIG. 2C. Finally, that part of the $n^+$ type amorphous silicon film 8 which is located between the source electrode 11 and the drain electrode 12 is etched away, exposing a part of the channel protective film 7.

As described above, in the first embodiment the gate insulating film 3a of the coplanar TFT and the gate insulating film 5b of the reverse stagger TFT have been formed by processing two separate insulating films, i.e., the first insulating film 3 and the second insulating film 5. Hence, the coplanar TFT can have a gate insulating film which has an optimal thickness, and so can the reverse stagger TFT.

Due to the first insulating film 3 located between the crystalline silicon film 2a of the coplanar TFT and the metal film of which the gate electrode 4b of the reverse stagger TFT will be formed, the metal film does not contact the crystalline silicon film 2a. No metal silicide will therefore be formed, and the resistance of the crystalline silicon film 2a will not decrease.

Moreover, the gate electrode 4b is not likely to exfoliate since it is formed on the first insulating film 3 which has a smooth and flat surface, not on the insulating substrate 1 which has a rough surface.

Figure 16A:
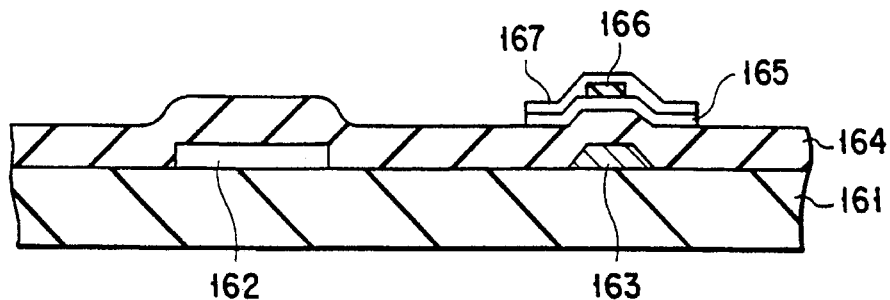
FIGS. 16A to 16D are sectional views explaining the remaining steps of the method of manufacturing the TFT substrate of the conventional active type liquid crystal display.
Figure 16B:
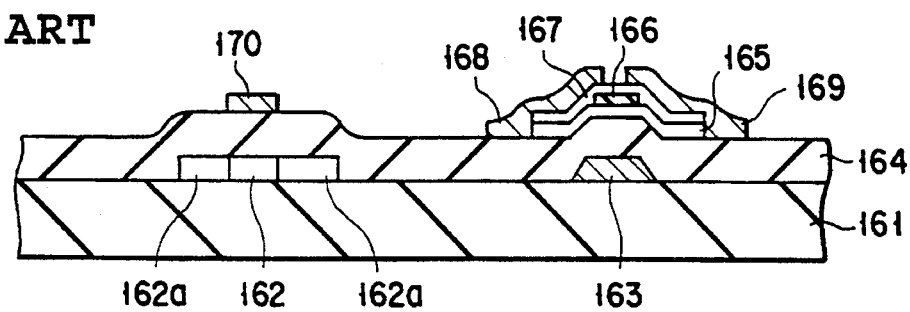
Figure 16C:
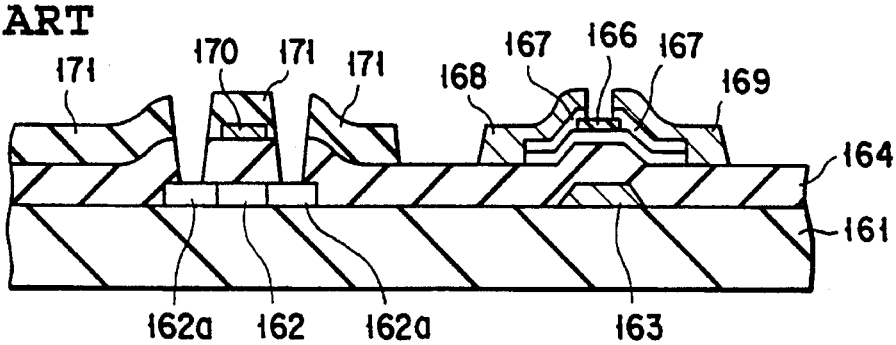
Figure 16D:
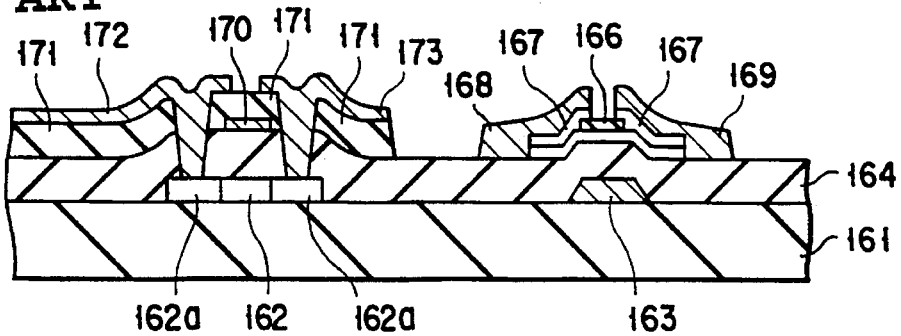

Furthermore, since the gate electrode 4a of the coplanar TFT and the gate electrode 4b of the reverse stagger TFT are provided of the same metal film, they can be shaped in a single step of photolithography. This helps to reduce the number of times photolithography is repeated to manufacture the TFT substrate. To be more specific, photolithography is repeated six times in six manufacturing steps of FIGS. 1A, 1B, 1C, 1D, 2A, 2B and 2C, respectively, whereas photolithography must be repeated eight times to manufacture the conventional TFT substrate—six times in six steps of FIGS. 15A, 15B, 15D, 16B, 16C and 16D, respectively, and twice in the step of FIG. 16A.

Other embodiments of the present invention will be described below, which differ from the first embodiment in respect of the combination of TFTs but are identical with regard to the method of forming the various films of each TFT.

FIGS. 4A to 4D and FIGS. 5A to 5C are sectional views explaining the steps of a method of manufacturing the TFT substrate of an active type liquid crystal display which is a second embodiment of the invention.

The right half of the structure shown in each of these figures is the pixel section of the TFT substrate, which comprises a stagger TFT. The left half of the structure is the drive section of the TFT substrate, which comprises a coplanar TFT for driving the stagger TFT. The stagger TFT is a switching element provided for one of the pixel electrodes (not shown) which are arranged in rows and columns on an insulating substrate.

How the TFT substrate, i.e., the second embodiment of the invention, is manufactured will now be explained, with reference to FIGS. 4A to 4D and FIGS. 5A to 5C.

Figure 4A:
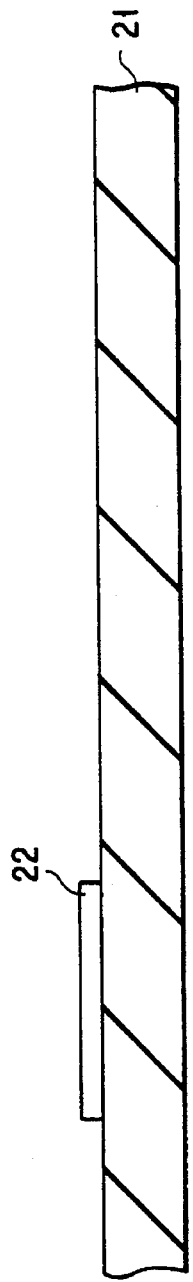
FIGS. 4A to 4D are sectional views explaining the first several steps of a method of manufacturing the TFT substrate of an active type liquid crystal display which is a second embodiment of this invention.

First, an amorphous silicon film 22 is formed on an insulating substrate 21 by means of CVD method such as plasma CVD method or LPCVD method. The film 22 is subjected to photolithography, forming an amorphous silicon film 22 having a prescribed shape and size, as illustrated in FIG. 4A. The film 22 has a thickness of, for example, 20 to 50 nm.

The insulating substrate 21 is made of insulating material such as glass or quartz. Alternatively, the substrate 21 may be a plate coated with insulating material.

Figure 4B:
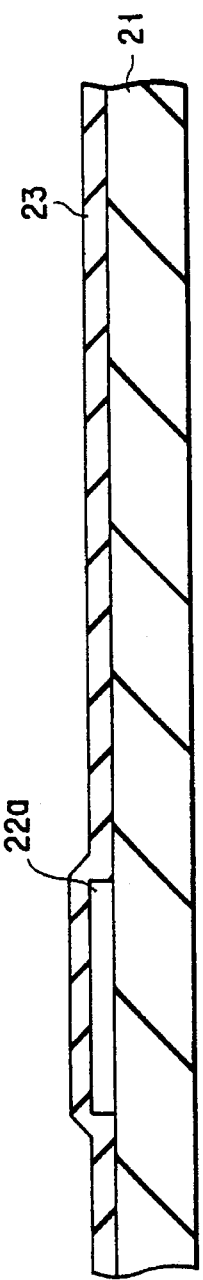

Next, as shown in FIG. 4B, a first insulating film 23 is formed on the upper surface of the entire structure. The film 23 will serve as the gate insulating of the coplanar TFT and also as the substrate-protecting film (i.e., lower insulating film) of the stagger TFT. The film 23 is made of, for example, silicon oxide and formed by, for example, ECR-CVD method, plasma CVD method or APCVD method. It is desirable that the first insulating film 23 have the same thickness as in the first embodiment, for the same reasons indicated above.

Thereafter, a high-energy beam, such as an excimer laser beam (more precisely, a beam emitted from an excimer laser), is applied onto the amorphous silicon film 22. The film 22 is thereby annealed and converted into a crystalline (either single crystal or polycrystalline) silicon film 22a, which serves as a high-resistance semiconductor film.

If necessary, dopant may be introduced into the amorphous silicon film 2 before the film 22 is irradiated with the high-energy beam, for example before the formation of the first insulating film 23.

Figure 4C:
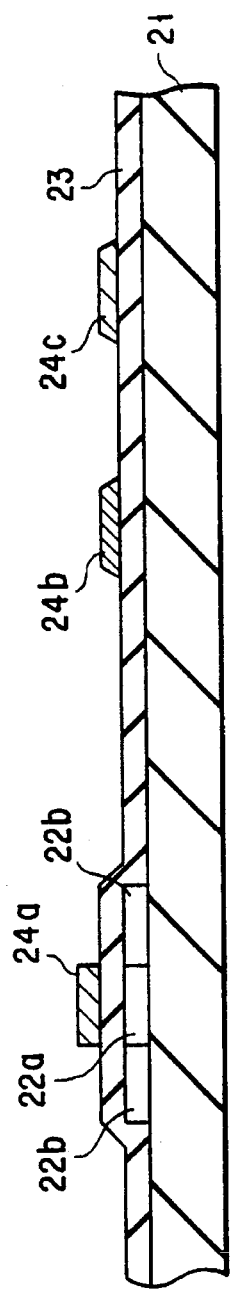

Then, a metal film is deposited on the upper surface of the entire structure by means of sputtering. The metal film is etched by photolithography (e.g., chemical dry etching), forming the gate electrode 24a of the coplanar TFT and the source electrode 24b and drain electrode 24c of the stagger TFT as is illustrated in FIG. 4C. The metal film has a thickness of, for example, 200 nm, and is made of, for example, MoTa alloy, aluminum (Al), MoW alloy or TaW alloy.

Two films of different metals may be formed—one forming the gate electrode of the coplanar TFT, and the other forming the source and drain electrodes of the stagger TFT. For instance, the source and drain electrodes of the stagger TFT may be made of, for example, ITO which is the material of pixel electrodes (i.e., transparent electrodes), while the gate electrode of the coplanar TFT is formed of the metal film described above.

The first insulating film 23 is located between the crystalline silicon film 22a (i.e., the high-resistance semiconductor film) of the coplanar TFT and the metal film of which the source electrode 24b and drain electrode 24c of the stagger TFT will be formed. In other words, the metal film does not contact the crystalline silicon film 22a (i.e., the high-resistance semiconductor film) which is a part of the coplanar TFT. Hence, no metal silicide will be formed, and the resistance of the crystalline silicon film 22a will not decrease.

While the amorphous silicon film 22 is being etched by chemical dry etching to form the structure shown in FIG. 4A, the insulating substrate 21 may have its surface roughened. Even so, the source electrode 24b and the drain electrode 24c will not exfoliate as in the manufacture of the conventional thin-film transistor device. This is because the source electrode 24b and the drain electrode 24c are formed on the first insulating film 23, not on the insulating substrate 21.

The insulating substrate 21 may have a rough surface from the beginning. In this case, the electrode 24b or 24c will not exfoliate, either, since it is the first insulating film 23, not the metal film, that contacts the insulating substrate 21. After the electrodes 24a, 24b and 24b have been formed, an impurity such as phosphorus (P), boron (B) or arsenic (As) is ion-implanted into the crystalline silicon film 22a, by using the gate electrode 24a as a mask. A high-energy beam, such as an excimer laser beam, is applied to a selected portion of the crystalline silicon film 22a, annealing this portion of the film 22a. That portion of the film 22a is thereby crystallized into a low-resistance crystalline silicon film 22b.

Figure 4D:
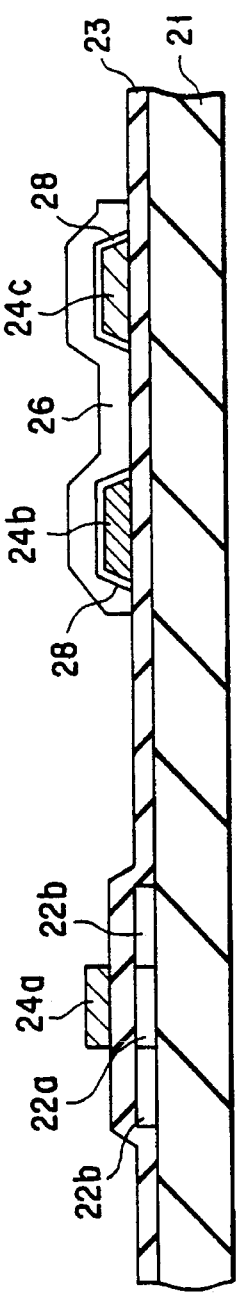

Next, an $n^+$ type amorphous silicon film 28 (having a thickness of, for example, 30 nm) is formed on the upper surface of the structure. The film 28 is etched by photolithography, into ohmic contact layers 28 of the stagger TFT as illustrated in FIG. 4D, which have prescribed shapes and sizes.

Then, an amorphous silicon film 26 (having a thickness of, for example, 50 nm) is formed on the upper surface of the structure. The film 26 is etched by photolithography into a film having a predetermined shape and size.

Figure 5A:
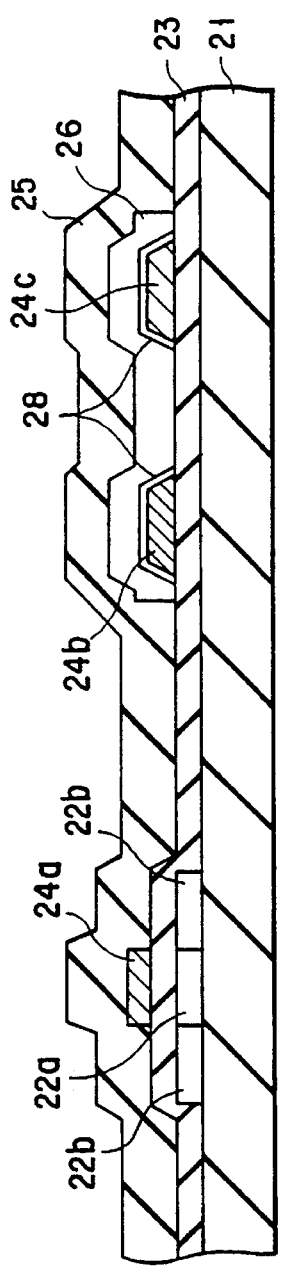
FIGS. 5A to 5C are sectional views explaining the remaining steps of the method of manufacturing the TFT substrate of the second embodiment.

Next, as shown in FIG. 5A, a second insulating film 25 is deposited on the upper surface of the entire structure. The second insulating film 25 will serve as an inter-layer insulating film in the coplanar TFT and also as the gate insulating film of the stagger TFT. The second insulating film 25 is, for example, a silicon oxide film, a silicon nitride film, or a multi-layer film composed of these. Its thickness is, for example, 200 to 400 nm, for the same reasons stated above in the description of the first embodiment.

Figure 5B:
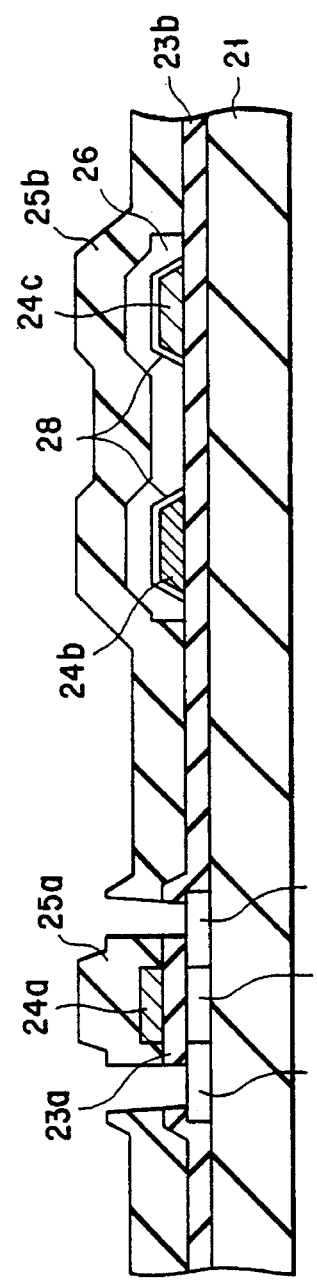

Thereafter, the first insulating film 23 and the second insulating film 25 are etched by photolithography. The first insulating film 23 is thereby cut, as shown in FIG. 5B, into the gate insulating film 23a of the coplanar TFT and the lower insulating film 23b of the stagger TFT. Similarly, the second insulating film 25 is thereby cut, as shown in FIG. 5B, into the interlayer insulating film 25a (upper insulating film) of the coplanar TFT and the gate insulating film 25b of the stagger TFT. Simultaneously, contact holes (not shown) are made in the films 23 and 25, in which the gate, source and drain electrodes of the coplanar TFT will be formed, and a contact hole (not shown) is made in the films 23 and 25, in which the gate electrode of the stagger TFT will be formed.

Figure 5C:
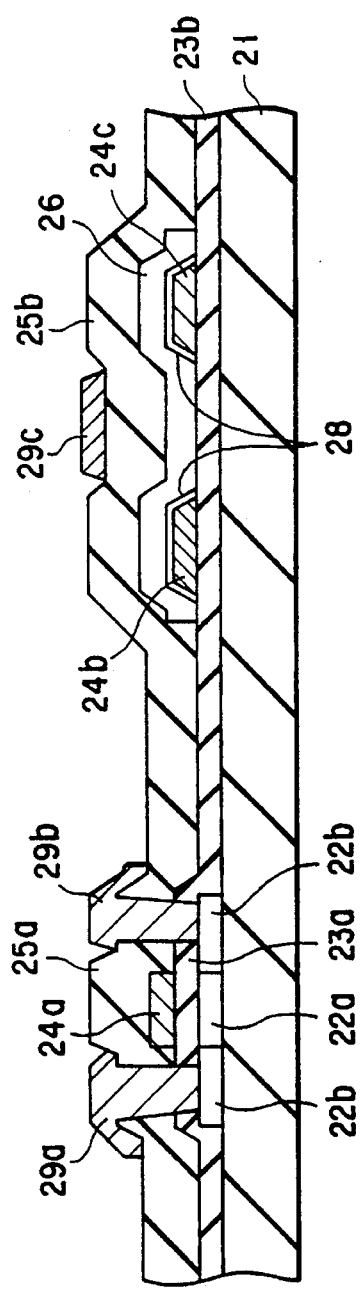

Next, two metal films are formed on the upper surface of the entire structure shown in FIG. 5B by means of, for example, sputtering. Each of the metal films is, for example, an Mo film, an Al film, a Cr film or a multi-layer film composed of these. The metal films are etched by means of photolithography, forming the source electrode 29a and drain electrode 29b of the coplanar TFT and also the gate electrode 29c of the stagger TFT, as is shown in FIG. 5C. The metal layer forming the electrodes of the coplanar TFT, and the metal layer forming the electrode of the stagger TFT may be of different metals.

Figure 6:
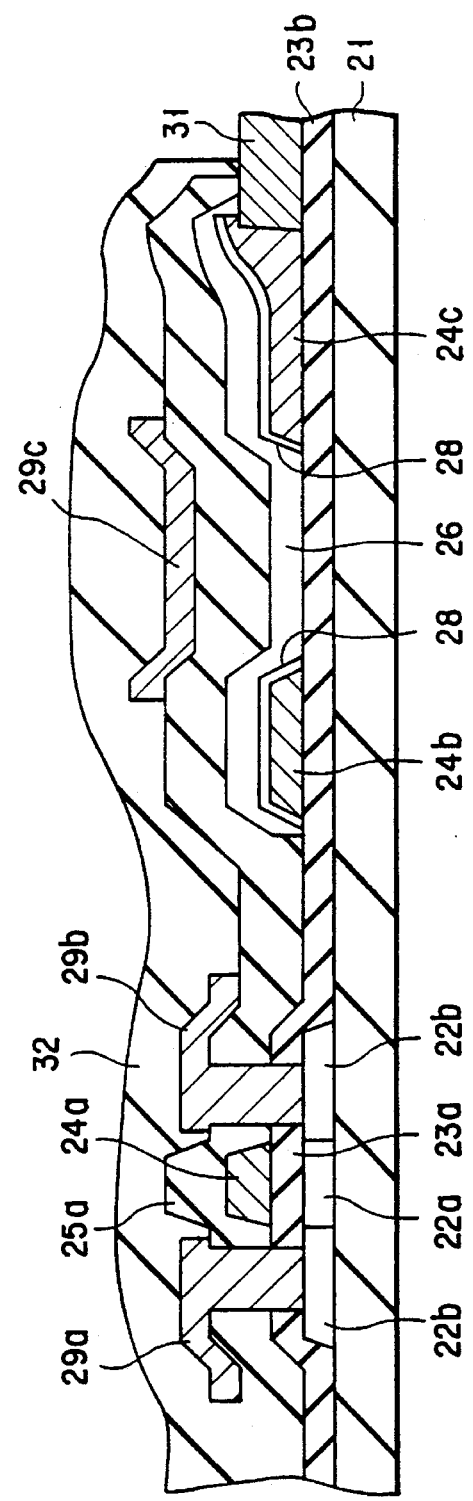
FIG. 6 is a sectional view illustrating the basic structure of the TFT substrate of the second embodiment.

As shown in FIG. 6, an ITO electrode 31 (a pixel electrode) is formed which contacts the drain electrode 24c of the stagger TFT, and a protective film 32 is formed on the upper surface of the structure, protecting both TFTs.

As described above, in the second embodiment the gate insulating film 23a of the coplanar TFT and the gate insulating film 25b of the stagger TFT have been formed by processing two separate insulating films, i.e., the first insulating film 23 and the second insulating film 25. Hence, the coplanar TFT can have a gate insulating film which has an optimal thickness, and so can the stagger TFT.

Due to the first insulating film 23 located between the crystalline silicon film 22a of the coplanar TFT and the metal film of which the source electrode 24b and drain electrode 24c of the stagger TFT will be formed, the metal film does not contact the crystalline silicon film 22a. No metal silicide will therefore be formed, and the resistance of the crystalline silicon film 22a will not decrease.

Moreover, the source electrode 24b and drain electrode 24c of the stagger TFT are not likely to exfoliate since they are provided on the first insulating film 23 which has a smooth and flat surface, not on the insulating substrate 21 which has a rough surface.

FIGS. 7A to 7D and FIGS. 8A to 8C are sectional views explaining the steps of a method of manufacturing the TFT substrate of an active type liquid crystal display which is a third embodiment of the present invention.

The right half of the structure shown in each of these figures is the pixel section of the TFT substrate, which comprises a reverse stagger TFT. The left half of the structure is the drive section of the TFT substrate, which comprises a stagger TFT for driving the reverse stagger TFT. The reverse stagger TFT is a switching element provided for one of the pixel electrodes (not shown) which are arranged in rows and columns on an insulating substrate.

How the TFT substrate, i.e., the third embodiment of the invention, is manufactured will now be explained, with reference to FIGS. 7A to 7D and FIGS. 8A to 8C.

First, a metal film is formed on an insulating substrate 41 by means of sputtering. The metal film is processed by chemical dry etching into the source electrode 49 and drain electrode 50 of the stagger TFT, as is illustrated in FIG. 7A. The metal film is made of, for example, MoTa alloy, aluminum (Al) or MoW alloy, and has a thickness of, for example, 200 nm. The insulating substrate 41 is made of insulating material such as glass or quartz. Alternatively, the substrate 41 may be a plate coated with insulating material.

After the electrodes 49 and 50 have been formed, an amorphous silicon film having a thickness of, for example, 20 to 50 nm, is formed on the substrate 41 by CVD method such as plasma CVD or LPCVD, covering both electrodes 49 and 50. The amorphous silicon film is etched by photolithography, forming a film having a predetermined shape and size. A high-energy beam, such as an excimer laser beam, is applied to a selected portion of the crystalline silicon film 42a, annealing the amorphous silicon film and, thus, converting it to a high-resistance crystalline (either single crystal or polycrystalline) silicon film 42a as illustrated in FIG. 7B. The amorphous silicon film may be annealed before it is etched or after an insulating film 43 is formed in the next step, for the same reasons indicated above in the description of the first embodiment.

Then, as is shown in FIG. 7C, the first insulating film 43 is formed on the entire surface of the structure of FIG. 7B, covering the crystalline film 42a and the surface of the substrate 41. The first insulating film 43 will serve as the gate insulating film of the stagger TFT and also as the protective film (i.e., lower insulating film) for the substrate of the reverse stagger TFT. The film 43 is made of, for example, silicon oxide; it is formed by CVD method such as ECR-CVD, plasma CVD or APCVD. It is desirable that the film 43 have the same thickness as in the first embodiment, for the same reasons indicated above in the description of the first embodiment.

A metal film is formed on the upper surface of the structure shown in FIG. 7C by means of sputtering. This metal film is etched by chemical dry etching into the gate electrode 44a of the stagger TFT and the gate electrode 44b of the reverse stagger TFT, as is illustrated in FIG. 7D. The metal film is made of, for example, MoTa alloy, aluminum (Al) or MoW alloy. The gate electrode 44a of the stagger TFT and the gate electrode 44b of the reverse stagger TFT may be of different metals.

After the gate electrodes 44a and 44b have been formed, an impurity such as phosphorus (P) or boron (B) is ion-implanted into the crystalline silicon film 42a, by using the gate electrode 44a as a mask. Then, a high-energy beam, such as an excimer laser beam, is applied to a selected portion of the crystalline silicon film 42a, annealing this portion of the film 42a. That portion of the film 42a is thereby crystallized into a low-resistance crystalline silicon film 42b.

Next, as shown in FIG. 8A, a second insulating film 45 is deposited on the upper surface of the entire structure. Then, an amorphous silicon film 46 is formed on the second insulating film 45. The second insulating film 45 will serve as an inter-layer insulating film (i.e., upper insulating film) in the stagger TFT and also as the gate insulating film of the reverse stagger TFT. The amorphous silicon film 46 will be used as the high-resistance semiconductor film in the reverse stagger TFT. The second insulating film 45 is desirably as thick as the second insulating film 5 of the first embodiment, for the same reasons stated above in the description of the first embodiment. To be specific, its thickness ranges from 200 to 400 nm. The film 45 is, for example, a silicon oxide film, a silicon nitride film, or a multi-layer film composed of these. The second insulating film 45 and the amorphous silicon film 46 are made of CVD method such as plasma CVD, photo CVD, APCVD or LPCVD.

Thereafter, an insulating film is formed on the upper surface of the entire structure by means of CVD method such as plasma CVD or photo CVD. This insulating film is etched by photolithography, forming the channel protective film 47 of the reverse stagger TFT.

The second insulating film 45 which will be processed into the gate insulating film of the reverse stagger TFT is separated from the first insulating film 43 of which the gate insulating film of the stagger TFT. Therefore, one of these insulating films can have a thicknesses different from that of the other. It follows that the gate insulating film of either TFT has an optimal thickness.

Next, an $n^+$ type amorphous silicon film 48 is formed on the upper surface of the structure. The film 48 and the amorphous silicon film 46 are etched by photolithography, into films 48 and 46 which have the same shape and size, as is illustrated in FIG. 8B. The film 48 will serve as the ohmic contact layer of the reverse stagger TFT. The $n^+$ type amorphous silicon film 48 is formed by means of CVD method such as plasma CVD or photo CVD. The film 48 may be replaced by a low-resistance semiconductor film of another semiconductor material.

Then, the first insulating film 43 and the second insulating film 45 are etched by photolithography, thereby forming three holes (not shown) in the film 43 and one hole (not shown) in the film 45. In the holes made in the film 43, the gate, source and drain electrodes of the stagger TFT will be formed. In the hole made in the film 45, the gate electrode of the reverse stagger TFT will be formed.

A metal film is formed by sputtering or the like on the upper surface of the structure shown in FIG. 8B. This metal film is etched by photolithography, thereby forming the source electrode 51 and drain electrode 52 of the reverse stagger TFT as illustrated in FIG. 8C. The metal films is, for example, an Mo film, an Al film, a Cr film or a multi-layer film composed of these.

Next, as shown in FIG. 8C, that portion of the $n^+$ amorphous silicon film 48 which is located between the source electrode 51 and drain electrode 52 of the reverse stagger TFT is etched away, thus exposing a part of the channel protective film 47 of the reverse stagger TFT.

Figure 9:
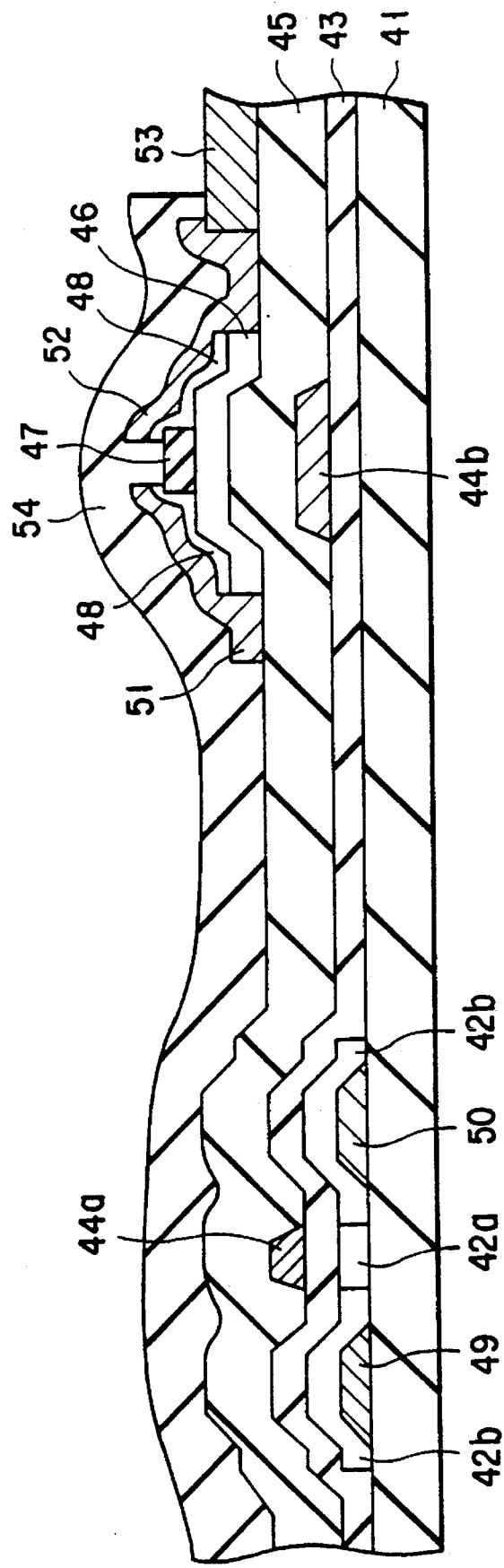
FIG. 9 is a sectional view illustrating the basic structure of the TFT substrate of the third embodiment.

As shown in FIG. 9, an ITO electrode 53 (a pixel electrode) is formed which contacts the drain electrode 52 of the stagger TFT, and a protective film 54 is formed on the upper surface of the structure, protecting both TFTs. Thus manufactured is the unit structure of a TFT substrate for use in an active liquid crystal display.

As described above, in the third embodiment the gate insulating film 43 of the stagger TFT and the gate insulating film 45 of the reverse stagger TFT have been formed by processing two separate insulating films, i.e., the first insulating film 43 and the second insulating film 45. Hence, the stagger TFT can have a gate insulating film which has an optimal thickness, and so can the reverse stagger TFT.

Due to the first insulating film 43 located between the crystalline silicon film 42a of the stagger TFT and the metal film of which the gate electrode 44b will be formed, the metal film does not contact the crystalline silicon film 42a. No metal silicide will therefore be formed, and the resistance of the crystalline silicon film 42a will not decrease.

In addition, the gate electrode 44b is not likely to exfoliate since it is provided on the first insulating film 43 which has a smooth and flat surface, not on the insulating substrate 41 which has a rough surface.

The stagger TFT, which is the left half of the TFT substrate, may be replaced by a reverse stagger TFT of the type similar to the reverse stagger TFT which is the right half of the TFT substrate shown in FIG. 9. In other words, the n+ type layer may be formed by deposition, not by ion implantation, provided that the n+ type layer has a sufficiently low resistance.

FIGS. 10A to 10E are sectional views explaining a method of manufacturing the TFT substrate of an active type liquid crystal display according to a fourth embodiment of this present invention.

How this TFT substrate is manufactured will now be explained, with reference to FIGS. 10A to 10E.

First, a polycrystalline silicon film having a thickness of 50 nm is formed on a transparent insulating substrate 61. The polycrystalline silicon film will be used as the high-resistance semiconductor films of TFTs which are to be formed. The film is etched by photolithography, forming a polycrystalline silicon film 62 having a prescribed shape and size, as is shown in FIG. 10A.

The polycrystalline silicon film may be formed by various methods. One alternative method is to form an amorphous silicon film on the substrate 61 by CVD method such as plasma CVD or LPCVD and then to apply an energy beam such as a laser beam, annealing or crystallizing the film into a polycrystalline silicon film. Another alternative method is to form a polycrystalline silicon film by means of plasma CVD using a material gas such as $SiH_4$, $SiF_4$ or $H_2$.

Next, an ITO film having a thickness of 100 nm is formed by sputtering on the upper surface of the structure. The ITO film is etched by photolithography, forming a pixel electrode 63 as shown in FIG. 10A. The pixel electrode 63 is used also as the first electrode of an auxiliary capacitor. The pixel electrode 63 may be formed prior to the formation of the polycrystalline silicon film 62.

Figure 10A:
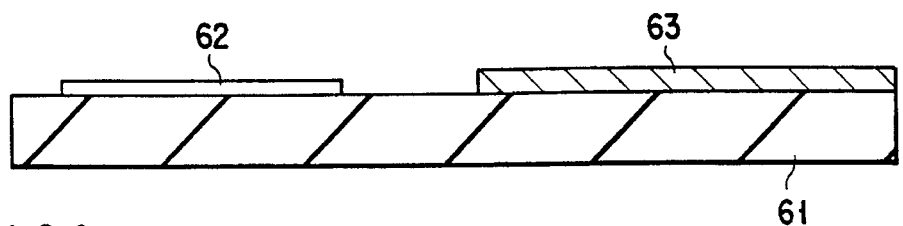
FIGS. 10A to 10E are sectional views explaining a method of manufacturing the TFT substrate of an active type liquid crystal display according to a fourth embodiment of the present invention.
Figure 10B:
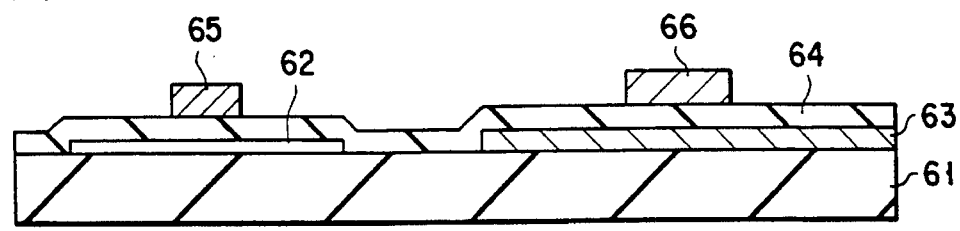

As shown in FIG. 10B, an insulating film 64 is formed on the upper surface of the structure shown in FIG. 10A. The insulating film 64 serves not only as an gate insulating film, but also as the insulating film of the auxiliary capacitor. The film 64 is made of, for example, silicon oxide or silicon nitride. It is formed by CVD method such as photo CVD, plasma CVD, APCVD or ECR-CVD.

Thereafter, a conductive film is formed to a thickness of 200 nm on the upper surface of the entire structure. The conductive film is etched by photolithography, thereby forming a gate electrode 65 and the second electrode 66 of the auxiliary capacitor, as is illustrated in FIG. 10B. The conductive film is made of, for example, MoTa alloy, Al, AlTa alloy, Ta, W, MoW alloy or silicide of any one of these. Alternatively, it may be a polycrystalline silicon film doped with an impurity (e.g., phosphorus, arsenic or boron) or a polycrystalline silicon film formed by crystallizing a amorphous silicon film by laser-beam annealing. If necessary, the surface of the conductive film may be anodized.

Figure 10C:
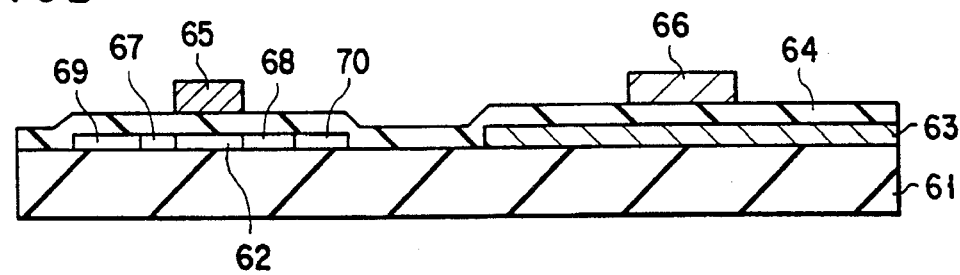

Then, as shown in FIG. 10C, impurity ions are implanted into the polycrystalline silicon film 62 by using the gate electrode 65 as a mask, thereby forming two LDD regions 67 and 68. A resist (not shown) is formed, covering both LDD regions 67 and 68. Furthermore, impurity ions are implanted into the polycrystalline silicon film 62 by using the resist and the gate electrode 65 as masks, thereby forming a source region 69 and a drain region 70. The source region 69 contacts the LDD region 67, and the drain region 70 contacts the LDD region 68.

The structure is then subjected to heat treatment such as laser-beam annealing, whereby the impurity in the polycrystalline silicon film 62 is activated.

Figure 10D:
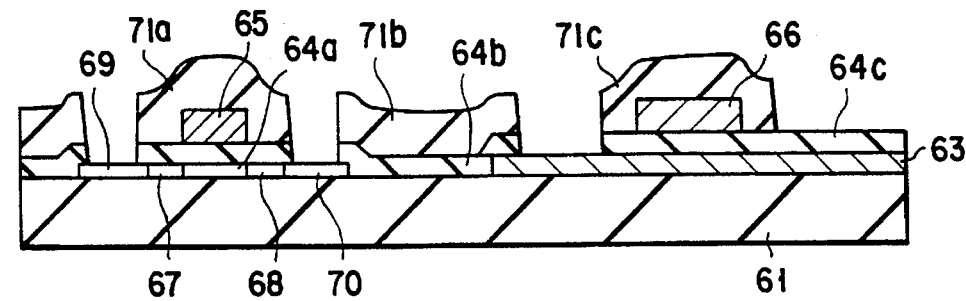

Next, an insulating film made of, for example, a silicon oxide or silicon nitride, is deposited by CVD method on the upper surface of the structure shown in FIG. 10C. This insulating film and the above-mentioned insulating film 64 are etched by photolithography. A hole exposing the gate electrode 65, a hole exposing the source region 69, a hole in which a drain electrode will be formed and a hole exposing the pixel electrode 63 are thereby formed as illustrated in FIG. 10D. At the same time, a gate insulating film 64a, a capacitor insulating film 64c and inter-layer insulating films 64b, 71a, 71b and 71c are formed as shown in FIG. 10D.

Figure 10E:
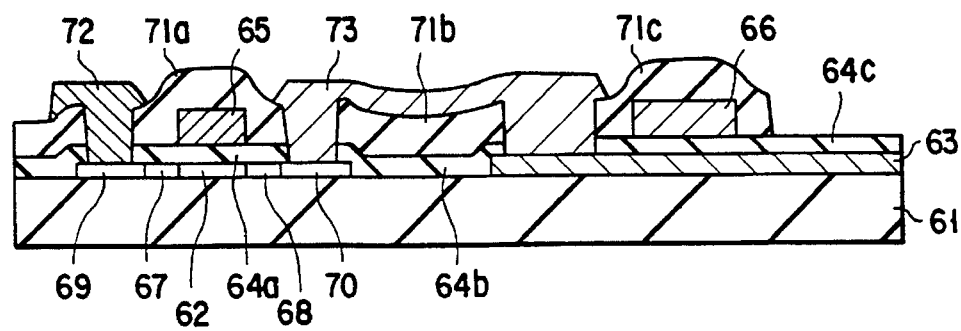
Figure 15A:
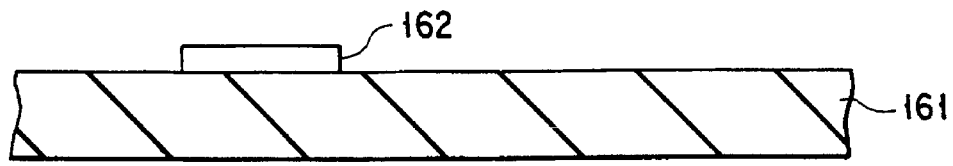
FIGS. 15A to 15D are sectional views explaining the first several steps of a method of manufacturing the TFT substrate of a conventional active type liquid crystal display.
Figure 15B:
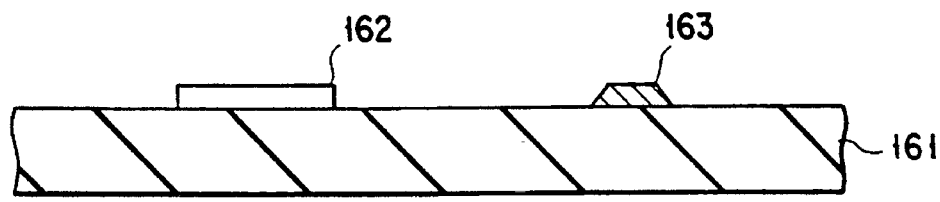
Figure 15C:
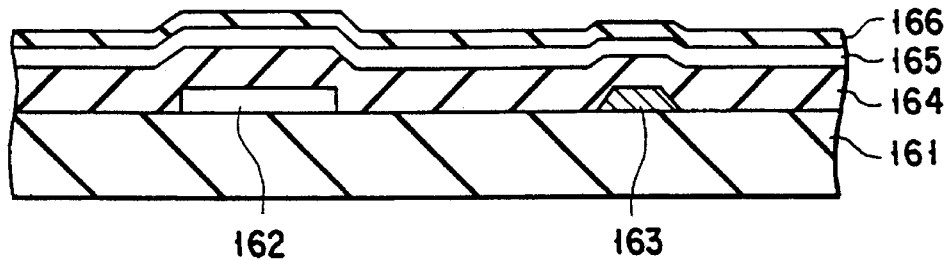
Figure 15D:
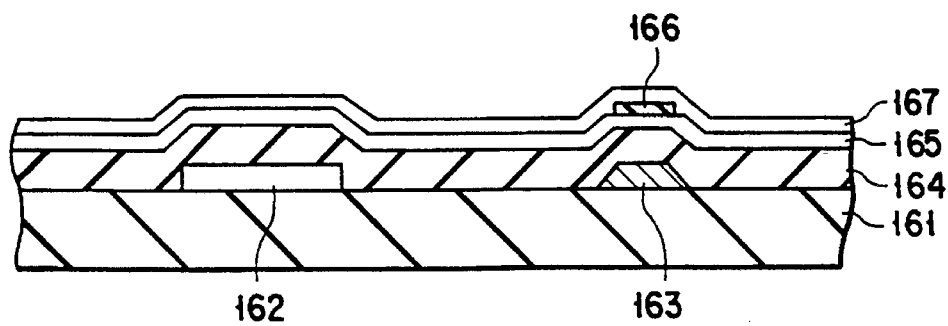

Then, a metal film, which is for example an Mo film, an Al film or a multi-layer film composed of these and which has a thickness of 300 nm, is formed by, for example, sputtering, on the upper surface of the structure shown in FIG. 10D. The metal film is etched by photolithography, forming a source electrode 72 and a drain electrode 73 as illustrated in FIG. 10E. Thereafter, a protective film is formed, if necessary, on the entire structure.

In the fourth embodiment, the auxiliary capacitor is composed of the second capacitor electrode 66, the capacitor insulating film 64c and the pixel electrode 63 (i.e., the first capacitor electrode). The capacitor insulating film 64c has been formed by processing a thin insulating film, together with the gate insulating film 64a. Therefore, it can serve to increase the capacitance despite that the capacitor electrode 66 is small in size. Since the capacitor electrode 66 is small, the aperture ratio can easily be increased to minimize the size of the pixel.

In the conventional TFT substrate shown in FIG. 13, the auxiliary capacitor is comprised of a second capacitor electrode 66, an inter-layer insulating film 71c (i.e., a capacitor insulating film) and a pixel electrode 63 (i.e., a first capacitor electrode). The capacitor insulating film 71c has been formed by processing a thick insulating film, together with an interlayer insulating film 71a of a TFT. To provide a sufficient capacitance, the capacitor electrode 66 must be made large. Consequently, it would be difficult to increase the aperture ratio in order to miniaturize the pixel.

In the case of the other conventional TFT substrate shown in FIG. 14, the auxiliary capacitor is comprised of a second capacitor electrode 66, a capacitor insulating film 64c and a low-resistance semiconductor film 74 (i.e., a first capacitor electrode). The capacitor insulating film 64c has been formed by processing a thin insulating film, together with a gate insulating film 64a of a TFT. Therefore, it is not difficult to increase the aperture ratio, unlike in the TFT substrate of FIG. 13. However, since this TFT substrate has semiconductor films 62, 67, 68, 69, 70 and 74 which have been formed by processing the same semiconductor film, the LDD regions 67 and 68, the source region 69 and the drain region 70 must be formed by separate steps of implanting impurity ions. The method of manufacturing this TFT substrate is inevitably complicated.

By contrast, the method of manufacturing the TFT substrate according to the fourth embodiment of the present invention is not complicated. This is because the pixel electrode 63 is used as the low-resistance semiconductor film 74 (i.e., the first capacitor electrode), since the polycrystalline silicon film 62, of which the regions 64, 67, 68, 69 and 70 of the TFT are formed, has been formed at low temperatures by applying an energy beam to an amorphous silicon film.

Since the polycrystalline silicon film 62 is formed at low temperatures, the pixel electrode 63 which is made of ITO, a material difficult to form at high temperatures, can be formed before the formation of the film 62. The pixel electrode 63 (i.e., the ITO film) can be used as the capacitor electrode as well.

FIG. 11 is a sectional view illustrating the basic structure of the TFT substrate according to the fifth embodiment of the present invention. This TFT substrate differs from the TFT substrate (FIG. 10E) of the fourth embodiment in two respects. First, the insulating films 71a and 71b are not separated from each other. Second, nor are the insulating films 64a and 64b separated from each other.

How this TFT substrate of FIG. 11 is manufactured will now be explained.

At first, the pixel electrode 63 made of ITO and having a thickness of 100 nm is formed on an insulating substrate 61. Then, a polycrystalline film having a thickness of, for example, 50 nm is formed, which will be processed into a source region 69, a drain region 70 and LDD regions 67 and 68. The polycrystalline silicon film is then etched by photolithography, forming a polycrystalline silicon film having a predetermined shape and size.

The polycrystalline silicon film is formed first by forming an amorphous silicon film on an insulating substrate 61 by CVD method such as plasma CVD or LPCVD and then by applying an energy beam such as a laser beam, annealing or crystallizing the amorphous silicon film. Alternatively, the film may be formed by means of plasma CVD using a material gas such as $SiH_4$, $SiF_4$ or $H_2$.

Next, an insulating film 64 made of, for example, silicon oxide or silicon nitride and having a thickness of, for example, 100 nm is formed on the upper surface of the resultant structure by means of CVD method, plasma CVD method or ECR-CVD method.

Thereafter, a conductive film, which will be processed into a gate electrode, is formed to a thickness of 200 nm on the upper surface of the structure. The conductive film is etched by photolithography, forming a gate electrode 65 and a second capacitor electrode 66. The conductive film is made of, for example, MoTa alloy, Al alloy, AlTa alloy, Ta, W, MoW alloy film or silicide of any of these. Alternatively, it may be a polycrystalline silicon film doped with an impurity (e.g., phosphorus, arsenic or boron) or a polycrystalline silicon film prepared by laser-beam annealing an amorphous silicon film. If necessary, the surface of the conductive film may be anodized. Furthermore, the conductive film may be made of a material different from that of the second capacitor electrode 66.

Then, as in the fourth embodiment, ions of an impurity are implanted into the polycrystalline silicon film 62 by using a resist and the gate electrode 65 as masks, thereby forming LDD regions 67 and 68, a source region 69 and a drain region 70. The structure is then subjected to heat treatment such as laser-beam annealing, whereby the impurity in the polycrystalline silicon film 62 is activated.

Next, an inter-layer insulating film 71 made of silicon oxide or silicon nitride is formed by, for example, CVD method on the upper surface of the resultant structure. The inter-layer insulating film 71 and the insulating film 64 are etched by means of photolithography, forming a hole exposing the gate electrode 65 and a hole in which a source electrode 72 will be formed.

Finally, a metal film having a thickness of 300 nm is formed on the upper surface of the structure. The metal film is etched by photolithography, forming a source electrode 72. If necessary, a protective film is formed on the entire structure.

FIG. 12 is a sectional view illustrating the basic structure of the TFT substrate according to the sixth embodiment of the invention. This TFT substrate is basically identical in structure to the TFT substrate (FIG. 11) of the fifth embodiment, except that the pixel electrode 64 is formed after the formation of the polycrystalline silicon film 62 which will be processed into a source region 69, a drain region 70 and LDD regions 67 and 68. This active liquid crystal display is manufactured in the same way as the fourth embodiment, except that the pixel electrode 64 is formed after the polycrystalline silicon film 62.

Figure 3:
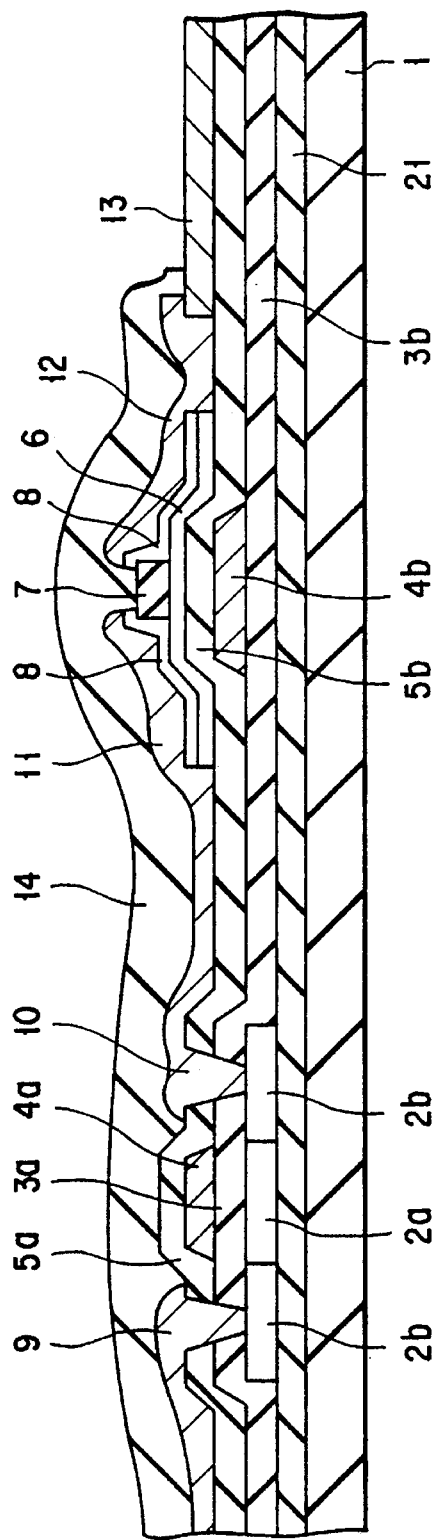
FIG. 3 is a sectional view showing a modification of the TFT substrate according to the first embodiment of the invention.

The present invention is not limited to the several embodiments described above. For instance, as shown in FIG. 3, an insulating film 21 may be formed on an insulating substrate 1 and an amorphous silicon film 2 and a first insulating film 3 may be formed on this film 21, whereas an amorphous silicon film and a first insulating film are formed directly on the insulating substrate in the embodiments described above. The TFT substrate of FIG. 3 comprises, an ITO electrode 13 and a protective film 14. In this TFT structure, the drain electrode 10 of the coplanar TFT is connected to the source electrode 11 of the reverse stagger TFT.

Furthermore, in the step shown in FIG. 1A, a polycrystalline silicon film having a specific shape and size may be used as the high-resistance semiconductor film of the coplanar TFT, in place of the amorphous silicon film 2 which has the predetermined shape and size. This polycrystalline silicon film can be formed, first by forming a polycrystalline silicon film by plasma CVD method using a mixture of $SiH_4$, $SiF_4$ and $H_2$ or by LPCVD method using $SiH_4$ or $Si_2H_6$, and then by etching the polycrystalline silicon film to have the predetermined shape and size.

Moreover, the present invention cay be applied to a TFT substrate wherein the TFTs of the pixel section are formed by using any semiconductor other than amorphous silicon, such as polycrystalline silicon.

The invention can also be applied to a TFT substrate wherein the TFTs of the pixel section differ from those of the drive section in regard to the material of the high-resistance semiconductor film.

Still further, the reverse stagger TFTs of the pixel section may be those made by self alignment technique. In this case the throughput is high. On the other hand, the coplanar TFTs of the drive section may be those having two gate electrodes each (double-gate structure). The drain region of each coplanar TFT can be of LDD structure so that the TFT may have its characteristics improved to enhance the quality of images which the liquid crystal display can display.

The embodiments of this invention, described above, are TFT substrates designed for use in liquid crystal displays. Nevertheless, the present invention can be applied to a TFT substrate for use in any other apparatuses, which comprises TFTs of different types formed on one and the same substrate.

Furthermore, various changes and modifications can be made without departing from the scope and spirit of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An integrated circuit device having an insulating substrate, comprising:

a thin-film transistor of a first type provided above said insulating substrate and having a first active layer;

a thin-film transistor of a second type provided on said insulating substrate and having a gate insulating film and a second active layer in contact with the insulating substrate; and a lower insulating film located beneath the thin-film transistor of the first type formed of a different material than a material of the insulating substrate, wherein said lower insulating film and the gate insulating film of said thin-film transistor of the second type are formed of a first insulating film provided on said insulating substrate, an upper insulating film is provided on said thin-film transistor of the second type, and said upper insulating film and a gate insulating film of said thin-film transistor of the first type are formed of a second insulating film provided on said insulating substrate.

2. An integrated circuit device according to claim 1, wherein said thin-film transistor of the first type is a reverse stagger type transistor, and said thin-film transistor of the second type is a coplanar type transistor.

3. An integrated circuit device having an insulating substrate, comprising:

a thin-film transistor of reverse stagger type provided above said insulating substrate and having a first active layer;

a thin-film transistor of coplanar type provided on said insulating substrate and having a gate insulating film and a second active layer in contact with the insulating substrate; and a lower insulating film located beneath the thin-film transistor of reverse stagger type formed of a different material than a material of the insulating substrate, wherein said lower insulating film and the gate insulating film of said thin-film transistor of coplanar type are formed of a first insulating film provided on said insulating substrate.

4. An integrated circuit device having an insulating substrate, comprising:

a pixel section including a plurality of pixel electrodes arranged in rows and columns on said insulating substrate and a plurality of thin-film transistors of a first type, connected as switching elements to the pixel electrodes, respectively;

a drive section including a plurality of thin-film transistors of a second type, each having a gate insulating film, for driving the thin-film transistors of the first type; and a lower insulating film located beneath the thin-film transistors of the first type, wherein said lower insulating film and the gate insulating films of said thin-film transistors of the second type are formed of a first insulating film provided on said insulating substrate, and wherein said thin-film transistors of the first type are reverse stagger type transistors, and said thin-film transistors of the second type are stagger type transistors.

5. An integrated circuit device according to claim 4, wherein said first insulating film has a thickness of 50 to 500 nm.

6. An integrated circuit device according to claim 4, wherein said first insulating film is made is one selected from the group consisting of a silicon oxide film, a silicon nitride film and a multi-layer film comprised of a silicon oxide film and a silicon nitride film.

7. An integrated circuit device according to claim 4, wherein said thin-film transistors of the reverse stagger type and said thin-film transistors of the coplanar type have gate electrodes which have been formed by processing a conductive film provided on said first insulating film.

8. An integrated circuit device having an insulating substrate, comprising:

a pixel section including a plurality of pixel electrodes arranged in rows and columns on said insulating substrate and a plurality of thin-film transistors of a first type, connected as switching elements to the pixel electrodes, respectively;

a drive section including a plurality of thin-film transistors of a second type, each having a gate insulating film, for driving the thin-film transistors of the first type; and a lower insulating film located beneath the thin-film transistors of the first type, wherein said lower insulating film and the gate insulating films of said thin-film transistors of the second type are formed of a first insulating film provided on said insulating substrate, and wherein said thin film transistors of the first type are stagger type transistors, and said thin film transistors of the second type are coplanar type transistors.

9. A liquid crystal display device having an insulating substrate, comprising:

a pixel section including a plurality of pixel electrodes arranged in rows and columns on said insulating substrate, a plurality of reverse stagger type thin-film transistors each having a first active layer connected as switching elements to the pixel electrode, respectively, a liquid crystal layer provided on the pixel electrodes and comprising molecules whose orientation is changed by a potential of each pixel electrode, and a substrate opposing said insulating substrate and sandwiching the liquid crystal layer, in cooperation with said insulating substrate;

a drive section including a plurality of coplanar type thin-film transistors arranged on said insulating substrate, each having a gate insulating film and a second active layer in contact with the insulating substrate, for driving the reverse stagger type thin-film transistors; and a lower insulating film located beneath said reverse stagger type thin-film transistors formed of a different material than a material of the insulating substrate, wherein said lower insulating film and the gate insulating films of said coplanar thin-film transistors are formed of a first insulating film provided on said insulating substrate.

10. An integrated circuit device having an insulating substrate comprising:

a pixel section including a plurality of pixel electrodes arranged in rows and columns on said insulating substrate and a plurality of thin-film transistors of a first type, connected as switching elements to the pixel electrodes, respectively;

a drive section including a plurality of thin-film transistors of a second type, each having a gate insulating film, for driving the thin-film transistors of the first type; and a lower insulating film located beneath the thin-film transistors of the first type, wherein said lower insulating film and the gate insulating films of said thin-film transistors of the second type are formed of a first insulating film provided on said insulating substrate, wherein said thin-film transistors of the first type are reverse stagger type transistors, and said thin-film transistors of the second type are coplanar type transistors, and wherein said first insulating film is made of a film selected from the group consisting of a silicon oxide film, a silicon nitride film and a multi-layer film comprised of a silicon oxide film and a silicon nitride film.

11. An integrated circuit device having an insulating substrate, comprising:

a pixel section including a plurality of pixel electrodes arranged in rows and columns on said insulating substrate and a plurality of thin-film transistors of a first type each having a first active layer, connected as switching elements to the pixel electrodes, respectively;

a drive section including a plurality of thin-film transistors of a second type, each having a gate insulating film and a second active layer in contact with the insulating substrate, for driving the thin-film transistors of the first type; and a lower insulating film located beneath the thin-film transistors of the first type formed of a different material than a material of the insulating substrate, wherein said lower insulating film and the gate insulating films of said thin-film transistors of the second type are formed of a first insulating film provided on said insulating substrate.

12. An integrated circuit device according to claim 11, wherein an upper insulating film is provided on said thin-film transistors of the second type, and said upper insulating film and a gate insulating films of said thin-film transistors of the first type are formed of a second insulating film provided on said insulating substrate.

13. An integrated circuit device according to claim 11, wherein said thin-film transistors of the first type are reverse stagger type transistors, and said thin-film transistors of the second type are coplanar type transistors.

14. An integrated circuit device according to claim 13, wherein said first insulating film has a thickness of 50 to 500 nm.

15. An integrated circuit device according to claim 13, wherein said thin-film transistors of the reverse stagger type and said thin-film transistors of the coplanar type have gate electrodes which are formed by processing a conductive film provided on said first insulating film.

* * * * *